United States Patent
Choi et al.

(10) Patent No.: US 9,257,573 B2
(45) Date of Patent: Feb. 9, 2016

(54) SEMICONDUCTOR DEVICE AND METHOD OF FABRICATING THE SAME

(71) Applicant: Samsung Electronics Co., Ltd., Gyeonggi-do (KR)

(72) Inventors: Ji-Hoon Choi, Seongnam-si (KR); Dong-Kyum Kim, Suwon-si (KR); Jin-Gyun Kim, Suwon-si (KR); Su-Jin Shin, Hwaseong-si (KR); Sang-Hoon Lee, Seongnam-si (KR); Ki-Hyun Hwang, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 100 days.

(21) Appl. No.: 13/949,447

(22) Filed: Jul. 24, 2013

(65) Prior Publication Data
US 2014/0084357 A1    Mar. 27, 2014

(30) Foreign Application Priority Data
Sep. 26, 2012  (KR) .................. 10-2012-0107304

(51) Int. Cl.
*H01L 29/792*  (2006.01)
*H01L 21/28*  (2006.01)
*H01L 27/115*  (2006.01)

(52) U.S. Cl.
CPC ...... *H01L 29/7926* (2013.01); *H01L 21/28008* (2013.01); *H01L 27/1157* (2013.01); *H01L 27/11582* (2013.01)

(58) Field of Classification Search
CPC ..................... H01L 29/7926; H01L 21/28008
See application file for complete search history.

(56) References Cited

U.S. PATENT DOCUMENTS

| | | | |
|---|---|---|---|
| 7,936,004 B2 | 5/2011 | Kito et al. | |
| 8,293,601 B2 | 10/2012 | Kito et al. | |
| 2005/0051806 A1 | 3/2005 | Masuoka et al. | |
| 2010/0006923 A1* | 1/2010 | Fujitsuka et al. | ............ 257/324 |
| 2011/0032772 A1* | 2/2011 | Aritome | ................. 365/185.29 |
| 2011/0266611 A1* | 11/2011 | Kim et al. | ...................... 257/324 |

FOREIGN PATENT DOCUMENTS

| | | |
|---|---|---|
| JP | 2003-092366 | 3/2003 |
| JP | 2011-014675 | 1/2011 |

* cited by examiner

*Primary Examiner* — Mohammed Choudhry
(74) *Attorney, Agent, or Firm* — F. Chau & Associates, LLC

(57) ABSTRACT

A semiconductor device is provided. The semiconductor includes a plurality of interlayer insulating layers and a plurality of gate electrodes alternately stacked in a first direction on a substrate. The plurality of interlayer insulating layers and the plurality of gate electrodes constitute a side surface extended in the first direction. A gate dielectric layer is disposed on the side surface. A channel pattern is disposed on the gate dielectric layer. The gate dielectric layer includes a protective pattern, a charge trap layer, and a tunneling layer. The protective pattern includes a portion disposed on a corresponding gate electrode of the plurality of gate electrodes. The charge trap layer is disposed on the protective pattern. The tunneling layer is disposed between the charge trap layer and the channel pattern. The protective pattern is denser than the charge trap layer.

13 Claims, 24 Drawing Sheets

SEMICONDUCTOR DEVICE AND METHOD OF FABRICATING THE SAME

CROSS-REFERENCE TO RELATED APPLICATION

This application claims priority under 35 U.S.C. §119 to Korean Patent Application No. 10-2012-0107304 filed on Sep. 26, 2012, the disclosure of which is incorporated by reference herein in its entirety.

TECHNICAL FIELD

The present inventive concept relates to a semiconductor device having a vertical cell, and a method of fabricating the same.

DISCUSSION OF RELATED ART

High-density semiconductor memory devices are in high demanded. Vertical cell-type semiconductor devices have been proposed to meet this demand. Vertical cell-type semiconductor devices may include elements configured in a three-dimensional structure.

SUMMARY

According to an exemplary embodiment of the inventive concept, a semiconductor device is provided. The semiconductor device includes a stack structure including a plurality of interlayer insulating layers and a plurality of gate electrodes alternately stacked on a substrate. A through hole vertically penetrates the stack structure and exposes a portion of the substrate. A vertical structure fills the through hole. The vertical structure includes a gapfill pattern formed at a center of the through hole. A channel pattern wraps an outer surface of the gapfill pattern and is in contact with the exposed portion of the substrate. A gate dielectric layer wraps an outer surface of the channel pattern. The gate dielectric layer includes a tunneling layer in contact with the channel pattern, a charge trap layer in contact with the tunneling layer, a barrier layer in contact with the charge trap layer, a protective pattern in contact with the barrier layer and denser than the barrier layer, and a blocking layer in contact with the protective pattern and a corresponding gate electrode of the plurality of gate electrodes.

According to an exemplary embodiment of the inventive concept, a semiconductor device is provided. The semiconductor includes a plurality of interlayer insulating layers and a plurality of gate electrodes alternately stacked in a first direction on a substrate. The plurality of interlayer insulating layers and the plurality of gate electrodes constitute a side surface extended in the first direction. A gate dielectric layer is disposed on the side surface. A channel pattern is disposed on the gate dielectric layer. The gate dielectric layer includes a protective pattern, a charge trap layer, and a tunneling layer. The protective pattern includes a portion disposed on a corresponding gate electrode of the plurality of gate electrodes. The charge trap layer is disposed on the protective pattern. The tunneling layer is disposed between the charge trap layer and the channel pattern. The protective pattern is denser than the charge trap layer.

According to an exemplary embodiment of the inventive concept, a method for manufacturing a semiconductor device is provided. A stack structure is formed on a substrate. The stack structure includes a plurality of interlayer insulating layers and a plurality of sacrificial layers alternately stacked in a first direction on the substrate. A through hole is formed. The through hole penetrates the stack structure and exposes a first side surface of the plurality of interlayer insulating layers and the plurality of sacrificial layers and a first portion of the substrate. A protective pattern is formed by performing an oxidation process on the side surface. A trench is formed and spaced apart from the through hole. The trench penetrates the stack structure and exposes a second side surface of the plurality of interlayer insulating layers and the plurality of sacrificial layers and a second portion of the substrate. The plurality of sacrificial layers not oxidized by the oxidation process is removed by an etchant provided through the trench to form an interlayer space between two adjacent interlayer insulating layers of the plurality of interlayer insulating layers. A gate pattern is formed in the interlayer space.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1A:
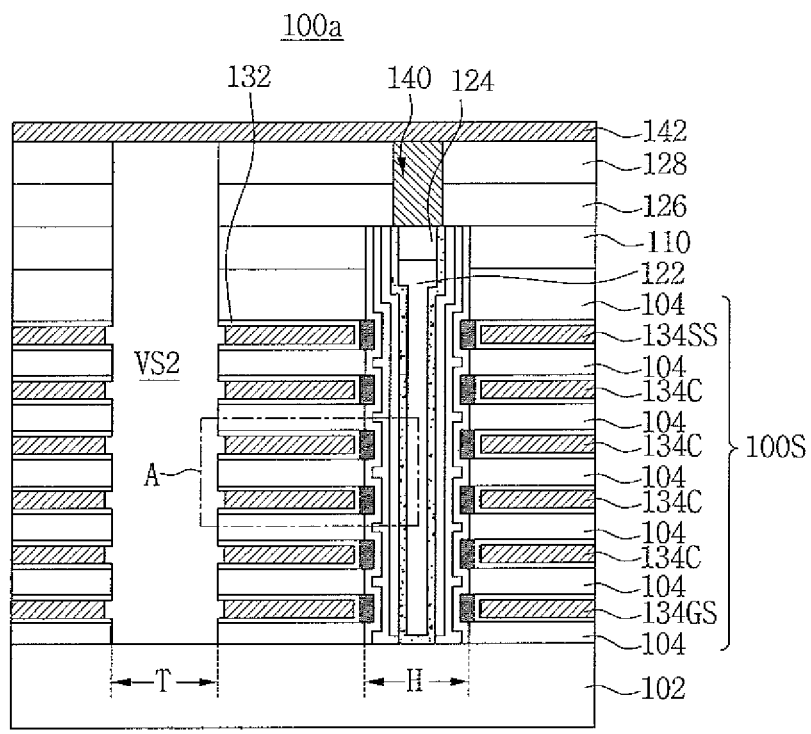
FIG. 1A is a cross-sectional view illustrating a vertical cell-type semiconductor device in accordance with an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

It will be understood that when an element or layer is referred to as being "on," "connected to" or "coupled to" another element or layer, it can be directly on, connected or coupled to the other element or layer or intervening elements or layers may be present.

As used herein, singular "a," "an" and "the" are intended to cover the plural forms as well, unless the context clearly indicates otherwise.

Figure 1B:
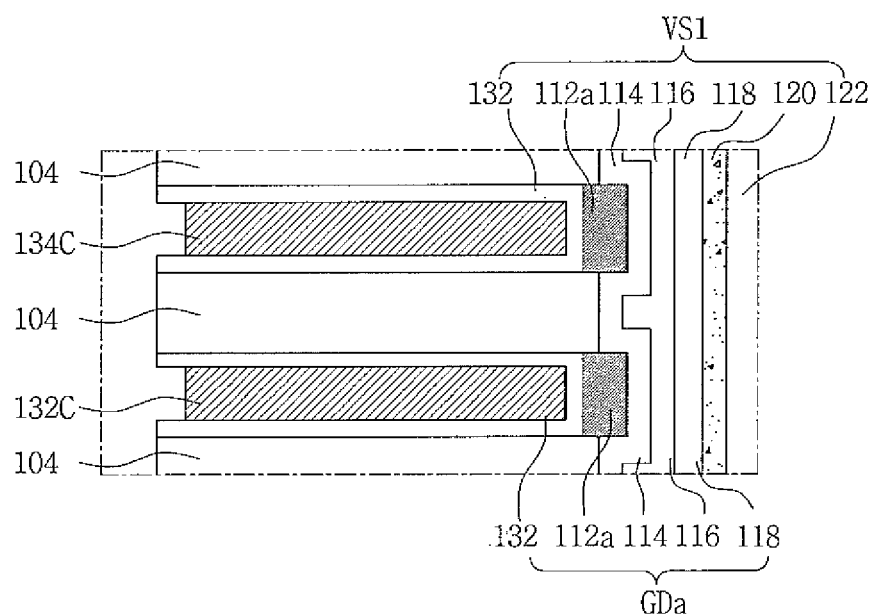
FIG. 1B is an enlarged cross-sectional view illustrating "A" of FIG. 1A.

FIG. 1A is a cross-sectional view showing a vertical cell-type semiconductor device in accordance with an exemplary embodiment of the inventive concept, and FIG. 1B is an enlarged cross-sectional view showing "A" of FIG. 1A.

Referring to FIGS. 1A and 1B, a vertical cell-type semiconductor device 100a in accordance with an exemplary embodiment may include a stack structure 100S formed on a substrate 102, a first capping layer 110 covers the stack structure 100S, a through-hole H penetrates the stack structure 110S and the first capping layer 110, a trench T is JO spaced apart from the through-hole H and vertically penetrates the stack structure 110S and the first to third capping layers 110, 126, and 128, first and second structures VS1 and VS2, respectively, fill the through-hole H and the trench T, a contact pad 124 is disposed on the first vertical structure VS1, a contact electrode 140 is disposed in the second and third capping layers 126 and 128 and is disposed on the contact pad 124, a conductive line 142 is disposed on a top surface of the third capping layer 128 and is disposed on the contact electrode 140.

The stack structure 104S includes an interlayer insulating layer 104 and gate electrodes 134GS, 134C, and 134SS which are alternately stacked. The interlayer insulating layer 104 may include a silicon oxide ($SiO_2$), and the gate electrodes 134GS, 134C, and 134SS may include tungsten (W), copper (Cu), aluminum (Al), titanium (Ti), titanium nitride (TiN), tantalum (Ta), and a conductive film such as doped silicon (n- or p-type Si).

The first vertical structure VS1 includes a gate dielectric layer (GDa) that is formed along an inner wall of the through-hole H, a cylindrical channel pattern 120 that is formed along an inner wall of the gate dielectric layer (GDa), and a gapfill pattern 122 that is formed at a center of the through-hole H to fill the inside of the channel pattern 120. The channel pattern 120 wraps an outer surface of the gapfill pattern 122, and the gate dielectric layer (GDa) wraps an outer surface of the channel pattern 120. A top surface of the gapfill pattern 122 is positioned lower than an upper end of the through-hole H. The through-hole H has a circular shape when viewed from above. The first vertical structure VS1 is symmetrically formed on the inner wall of the through-hole H in a cross-sectional view thereof. A lower portion of the channel pattern 120 may be in contact with a surface of the substrate 102 that corresponds to a bottom surface of the through-hole H, and an upper portion thereof may be in contact with a side surface of the contact pad 124. The channel pattern 120 may include a semiconductor material such as single crystalline silicon or poly-crystalline silicon.

The substrate 102 may include a semiconductor substrate such as a silicon (Si) substrate, a silicon-germanium (Si—Ge) substrate, and/or a silicon on insulator (SOI) substrate.

The contact pad 124 may include a conductive film such as a semiconductor material including single crystalline silicon or poly-crystalline silicon. The first to third capping layers 110, 126, and 128 may include an insulating material such as silicon oxide. The contact electrode 140 and the conductive line 142 may include a conductive material such as copper (Cu), tungsten (W), and/or aluminum (Al).

The lowermost gate electrode 134GS of a plurality of gate electrodes 134GS, 134C, and 134SS may serve as a ground selection gate electrode 134GS, the uppermost gate electrode 134SS may serve as a string selection gate electrode 134SS, and the gate electrode 134C between the ground selection gate electrode 134GS and the string selection gate electrode s134SS may serve as a cell gate electrode 134C.

Accordingly, the ground selection gate electrode 134GS, the gate dielectric layer (GDa) in contact with the ground selection gate electrode 134GS, and the channel pattern 120 may constitute a ground selection transistor, and the cell gate electrodes 134C, the gate dielectric layer (GDa) in contact with the cell gate electrodes 134C, and the channel pattern 120 may constitute a cell transistor. The string selection gate electrode 134SS, the gate dielectric layer (GDa) in contact with the string selection gate electrode 134SS, and the channel pattern 120 may constitute a string selection transistor. In this manner, the ground selection transistor, a plurality of cell transistors, and the string selection transistor may form a unit vertical cell string. The conductive line 142 may serve as a bit line.

The second vertical structure VS2 is formed into a fence shape that fills the trench T. The second vertical structure VS2 may include silicon oxide.

Referring again to FIG. 1B, the gate dielectric layer (GDa) includes a blocking layer 132, a protective pattern 112a, a barrier layer 114, a charge trap layer 116, and a tunneling layer 118. The blocking layer 132 is in contact with a top surface, a bottom surface, and a side surface of each of the gate electrodes 134GS, 134C, and 134SS and wraps the top surface, the bottom surface, and the side surface thereof. The protective pattern 112a is in contact with one vertical side surface of the blocking layer 132. The barrier layer 114 is in contact with the other surfaces of the protective patterns 112a which are not in contact with the blocking layers 132, side surfaces of the interlayer insulating layers 104, and a side surface of the first capping layer 110. The charge trap layer 116 is in contact with the barrier layer 114. The tunneling layer 118 is in contact with the charge trap layer 116.

The protective pattern 112a may include silicon oxide or oxidized silicon. The protective pattern 112a may have a higher density than that of the interlayer insulating layer 104 and barrier layer 114. (i.e., the protective pattern may be denser than the interlayer insulation layer 104 and barrier layer 114). A process of forming the protective pattern 112a may include a thermal oxidation process (e.g., an In Situ Steam Generation (ISSG) process), a plasma oxidation process, or a cleaned oxidation (CLN) process using hydrogen chloride (HCl)).

The protective pattern 112a is disposed between two adjacent interlayer insulating layers 104 and partially overlaps the two adjacent interlayer insulating layers 104. The protective pattern 112a has one side surface facing towards the channel pattern 120. The protective pattern 112a has the other side surface facing towards the gate electrodes 134C. The protective pattern 112a includes a top surface and a bottom surface which are in contact with the bottom and top surface of each of the interlayer insulating layers 104. The protective pattern 112a is in contact with the side surfaces of the interlayer insulating layers 104. A part of the top surface and bottom surface of the protective pattern 112a is in contact with the barrier layer 114.

The barrier layer 114 includes an uneven surface. For example, the barrier layer 114 covers the interlayer insulating layers 104 and the protective pattern 112a. The protective pattern 112a is disposed between two adjacent interlayer insulating layers 104 and protrudes towards the channel pattern 120. The barrier layer 114 may include a deposited silicon oxide.

The charge trap layer 116 is in contact with the barrier layer 114. The charge trap layer 116 may serve as an information storage layer that traps and holds electrons injected through the tunneling layer 118. The electrons trapped within the charge trap layer 116 may be removed from the charge trap layer 116. The charge trap layer 116 may include silicon nitride (SiNx), aluminum oxide ($Al_2O_3$), zirconium oxide (ZrO), hafnium oxide (HfO), and/or lanthanum oxide (LaO). The material forming the charge trap layer 116 may include a dielectric material having a higher dielectric constant than the silicon oxide.

The tunneling layer 118 may serve as a path through which electrons move to the charge trap layer 116 from the channel pattern 120, and may include a silicon oxide or a nitrogen-doped silicon oxide.

The blocking layer 132 may prevent the electrons stored in the charge trap layer 116 from tunneling to the cell gate electrode 134C, thereby increasing an information preservation time. The blocking layers 132 are in contact with the top surface and/or the bottom surface of each of the interlayer insulating layers 104. The blocking layer 132 may include an insulating material having a high work function such as aluminum oxide ($Al_2O_3$) and/or hafnium oxide (HfO).

The vertical cell type semiconductor device 100a includes the barrier layer 114 formed between the gate electrodes 134GS, 134C, and 134SS and the charge trap layer 116. The protective pattern 112a may include silicon oxide or oxidized silicon formed by an oxidation process. The oxidation process may include a thermal oxidation process (e.g., an ISSG process, a plasma oxidation process, or a CLN process). The protective pattern 112a may have a higher density than that of the interlayer insulating layer 104 and barrier layer 114 which are formed by a deposition process, thereby preventing the charge trap layer 116 and the barrier layer 114 from being damaged, and increasing information preservation time of the charge trap layer 116.

Figure 2A:
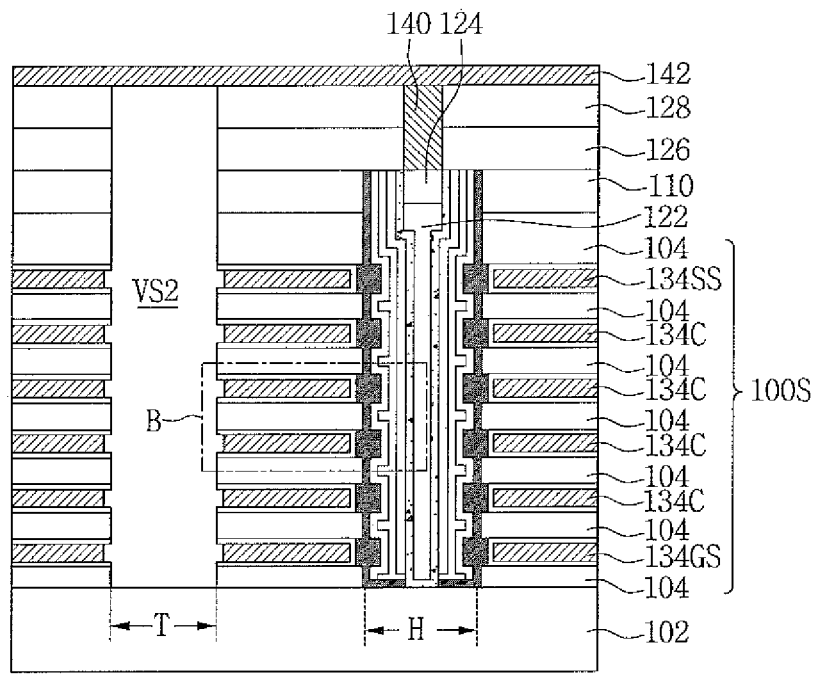
FIG. 2A is a cross-sectional view illustrating a vertical cell-type semiconductor device in accordance with an exemplary embodiment of the inventive concept.
Figure 2B:
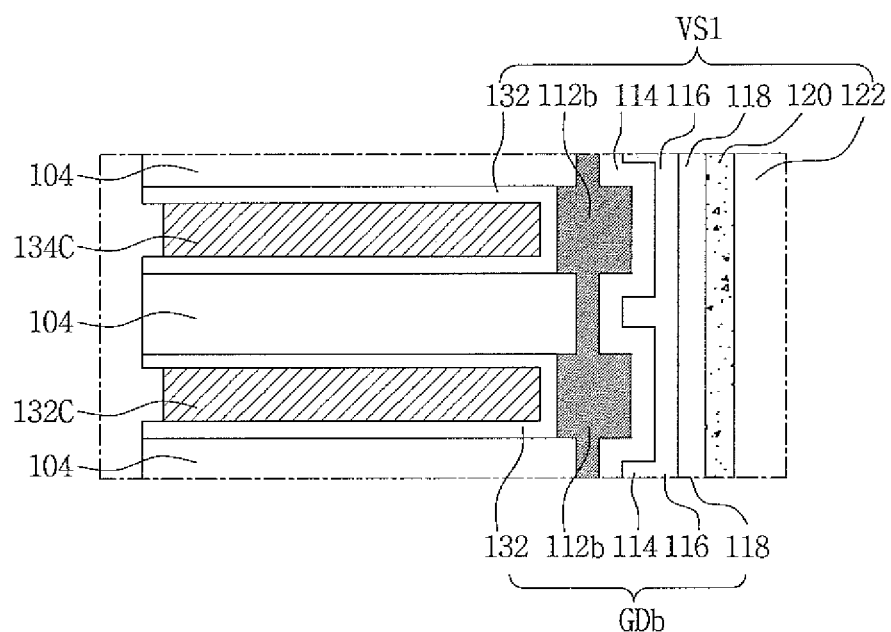
FIG. 2B is a cross-sectional view illustrating an enlargement of "B" of FIG. 2A.

FIG. 2A is a cross-sectional view showing a vertical cell-type semiconductor device in accordance with an exemplary embodiment of the inventive concept, and FIG. 2B is a cross-sectional view showing an enlargement of "B" of FIG. 2A.

Referring to FIGS. 2A and 2B, a vertical cell type semiconductor device 100b according to an exemplary embodiment of the inventive concept is shown. The vertical to cell type semiconductor 100b includes a stack structure 100S in which an interlayer insulating layer 104 and gate electrodes 134GS, 134C, and 134SS are alternately and repeatedly stacked on a substrate 102. First, second, and third capping layers 110, 126, and 128 cover the stack structure 100S. A through-hole H penetrates the stack structure 100S and the first capping layer 110. A trench T penetrates the stack structure 100S, the first capping layer 110, the second capping layer 126, and the third capping layer 128. First and second vertical structures VS1 and VS2, respectively, fill the through-hole H and the trench T. A contact pad 124 is in contact with the first vertical structure VS1. A contact electrode 140 penetrates the second capping layer 126 and the third capping layer 128 and is in contact with the contact pad 124. A conductive line 142 is formed on a top surface of the third capping layer 128 and is in contact with the contact electrode 140.

The first vertical structure VS1 includes a cylindrical gate dielectric layer (GDb) that is formed along an inner wall of the through-hole H, a channel pattern 120 that is formed along an inner wall of the gate dielectric layer (GDb), and a gapfill pattern 122 that fills the inside of the channel pattern 120. The channel pattern 120 is in contact with a surface of the substrate 102 that corresponds to a bottom surface of the through-hole H and a side surface of the contact pad 124.

The gate dielectric layer (GDb) includes a tunneling layer 118 that wraps the channel pattern 120, a charge trap layer 116 that wraps the tunneling layer 118, a barrier layer 114 that wraps the charge trap layer 116, a protective pattern 112b that wraps the barrier layer 114, and blocking layers 132 that are in contact with the protective pattern 112b and wrap the gate electrodes 134GS, 134C, and 134SS. The blocking layers 132 wrap a top surface, a bottom surface, and one side surface of each of the gate electrodes 134SS, 134C, and 134GS. The one side surface of each of the gate electrodes 134SS, 134C, and 134GS faces toward the channel pattern 120.

The protective pattern 112b may include silicon oxide or oxidized silicon formed by an oxidation process. The oxidation process may include a thermal oxidation process (e.g., an ISSG process, a plasma oxidation process, or a CLN process). The barrier layer 114 may include silicon oxide formed by a deposition process. The protective pattern 112b may have a higher density than that of the interlayer insulating layer 104 and barrier layer 114 which are formed by a deposition process, thereby preventing the charge trap layer 116 from being damaged, and increasing information preservation time of the charge trap layer 116. The protective pattern 112b has an uneven surface and covers the barrier layer 114 and the interlayer insulating layers 104. For example, a portion of one side surface of the protective patterns 112b protrudes toward the channel pattern 120. The protective pattern 112b has a portion of the other side surface that protrudes towards the gate electrodes 134C. The protruded portion of the other side surface of the protective pattern 112b is partially disposed between two adjacent interlayer insulating layers 104. The protective pattern 112b is formed on the side surfaces of the interlayer insulating layers 104 facing towards the channel pattern 120. The protruded portion of the one side surface of the protective pattern 112b is partially in contact with the barrier layer 114.

Figure 3A:
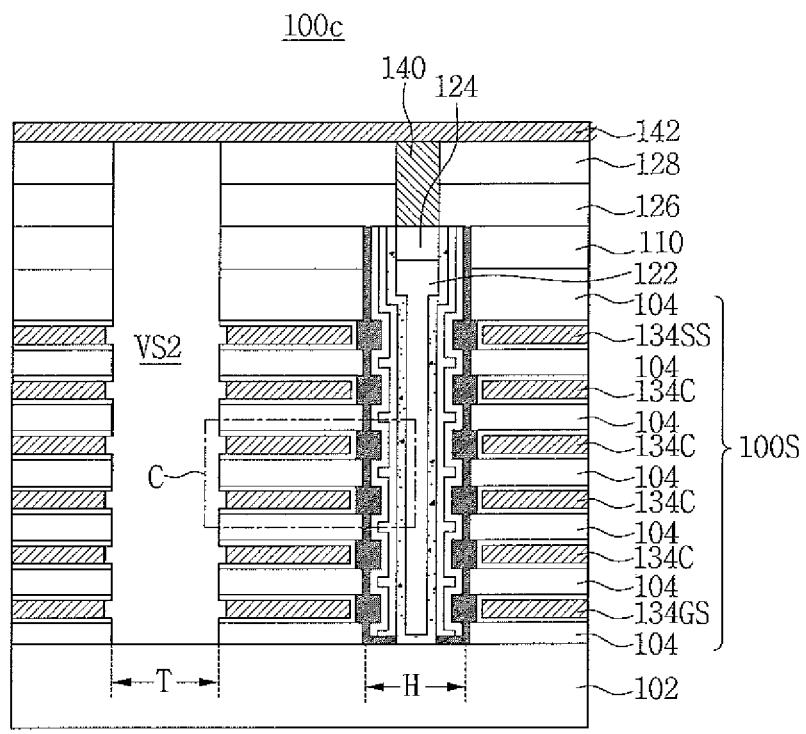
FIG. 3A is a cross-sectional view illustrating a vertical cell-type semiconductor device in accordance with an exemplary embodiment of the inventive concept.
Figure 3B:
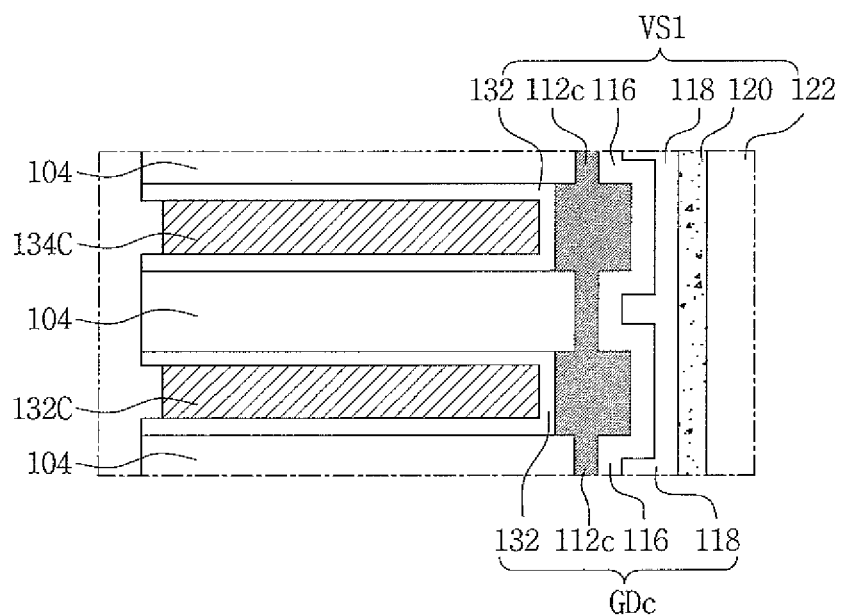
FIG. 3B is a cross-sectional view illustrating an enlargement of "C" of FIG. 3A.

FIG. 3A is a cross-sectional view showing a vertical cell-type semiconductor device in accordance with an exemplary embodiment of the inventive concept, and FIG. 3B is a cross-sectional view showing an enlargement of "C" of FIG. 3A.

Referring to FIGS. 3A and 3B, a vertical cell-type semiconductor device 100c in accordance with an exemplary embodiment of the inventive concept includes a stack structure 100S in which an interlayer insulating layer 104 and gate electrodes 134GS, 134C, and 134SS are alternatively and repeatedly stacked on a substrate 102. First, second and third capping layers 110, 126 and 128 cover the stack structure 100S. A through-hole H penetrates the stack structure 100S, and the first capping layer 110. A trench T penetrates the stack structure 100S, the first capping layer 110, the second capping layer 126, and the third capping layer 128. First and second vertical structures VS1 and VS2, respectively, fill the through-hole H and the trench T. A contact pad 124 is in contact with the first vertical structure VS1. A contact electrode 140 penetrates the second and third capping layers 126 and 128 and is in contact with the contact pad 124. A conductive line 142 is formed on a top surface of the third capping layer 128 and is in contact with the contact electrode 140.

The first vertical structure VS1 includes a gate dielectric layer (GDc) that is formed along an inner wall of the through-hole H, a cylindrical channel pattern 120 that is formed along an inner wall of the gate dielectric layer (GDc), and a gapfill pattern 122 that fills the inside of the channel pattern 120.

The gate dielectric layer (GDc) includes a tunneling layer 118 that wraps the channel pattern 120, a charge trap layer 116 that wraps the tunneling layer 118, a protective pattern 112c that wraps the charge trap layer 116, and a blocking layer 132 that wraps the gate electrodes 134GS, 134C, and 134SS.

The protective pattern 112c may include silicon oxide or oxidized silicon formed by a thermal oxidation process (e.g., an ISSG process, a plasma oxidation process, or a CLN process). The protective pattern 112c may have a higher density than that of the interlayer insulating layer 104 and the charge trap layer 116 which are formed by a deposition process, thereby preventing the charge trap layer 116 from being damaged, and increasing information preservation time of the charge trap layer 116. The protective pattern 112c is a substantially similar in structure to that of FIGS. 2A and 2B, except that the protective pattern 112c is in contact with the charge trap layer 116.

Figure 4A:
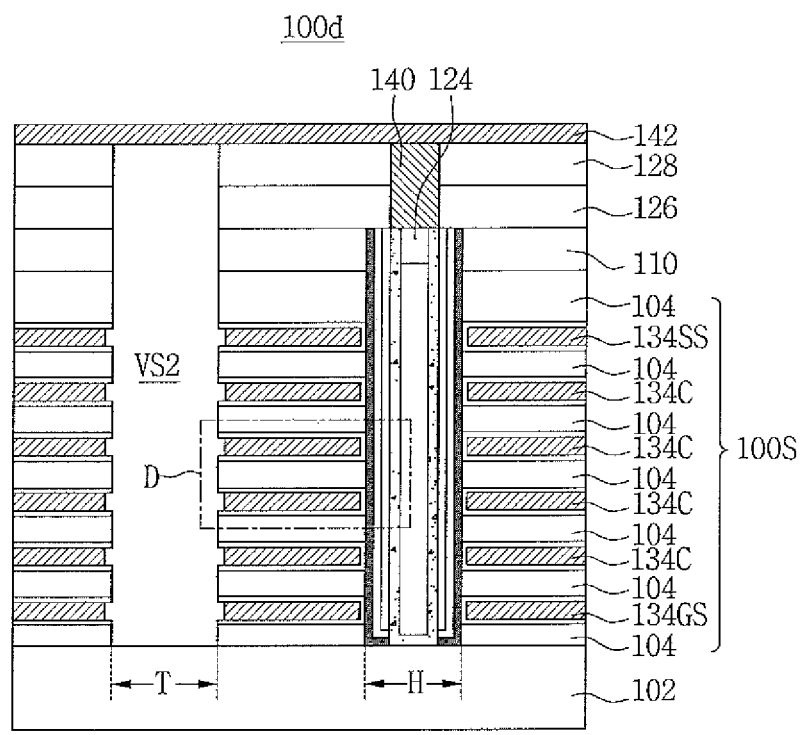
FIG. 4A is a cross-sectional view illustrating a vertical cell-type semiconductor device in accordance with an exemplary embodiment of the inventive to concept.
Figure 4B:
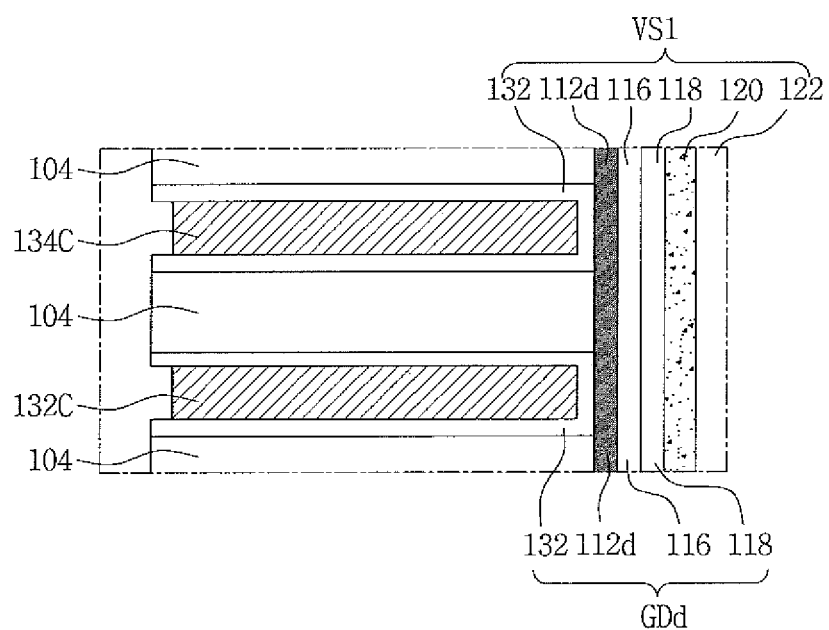
FIG. 4B is a cross-sectional view illustrating an enlargement of "D" of FIG. 4A.

FIG. 4A is a cross-sectional view showing a vertical cell-type semiconductor device in accordance with an exemplary embodiment of the inventive concept, and FIG. 4B is a cross-sectional view showing an enlargement of "D" of FIG. 4A.

Referring to FIGS. 4A and 4B, a vertical cell-type semiconductor device 100d in accordance with an exemplary embodiment of the inventive concept may include a stack structure 100S that is formed on a substrate 102. The stack structure is a substantially similar as that described above. First, second, and third capping layers 110, 126, and 128 cover the stack structure 100S. A through-hole H penetrates the stack structure 100S and the first capping layer 110. A trench T penetrates the stack structure 100S. First and second vertical structures VS1 and VS2, respectively, fill the through-hole H and the trench T. A contact pad 124 is electrically connected to the first vertical structure VS1, and a contact electrode 140 penetrates the second and third capping layers 126 and 128 to be in contact with the contact pad 124. A conductive line 142 is formed on a top surface of the third capping layer and is in contact with the contact electrode 140.

The first vertical structure VS1 may include a cylindrical gate dielectric layer (GDd) that is formed along an inner wall of the through-hole H, a cylindrical channel pattern 120 that is in contact with the gate dielectric layer (GDd), and a gapfill pattern 122 that fills the inside of the channel pattern 120.

The gate dielectric layer (GDd) includes a tunneling layer 118 that wraps the channel pattern 120, a charge trap layer 116 that wraps the tunneling layer 118, a protective pattern 112d that wraps the charge trap layer 116, and blocking layers 132 that are in contact with the protective pattern 112d and wrap the gate electrodes 134GS, 134C, and 143SS.

The protective pattern 112d may include silicon oxide or oxidized silicon formed by an oxidation process. The oxidation process may include a thermal oxidation process (e.g., an ISSG process, a plasma oxidation process, or a CLN process). The barrier layer 114 may include silicon oxide formed by a deposition process. The protective pattern 112b may have a higher density than that of the interlayer insulating layer 104 and the charge trap layer 116 which are formed by a deposition process, thereby preventing the charge trap layer 116 from being damaged, and increasing information preservation time of the charge trap layer 116. The protective pattern 112d is in contact with the interlayer insulating layers 104 and the blocking layers 132. The protective pattern 112d is in contact with the charge trap layer 116.

Figure 5A:
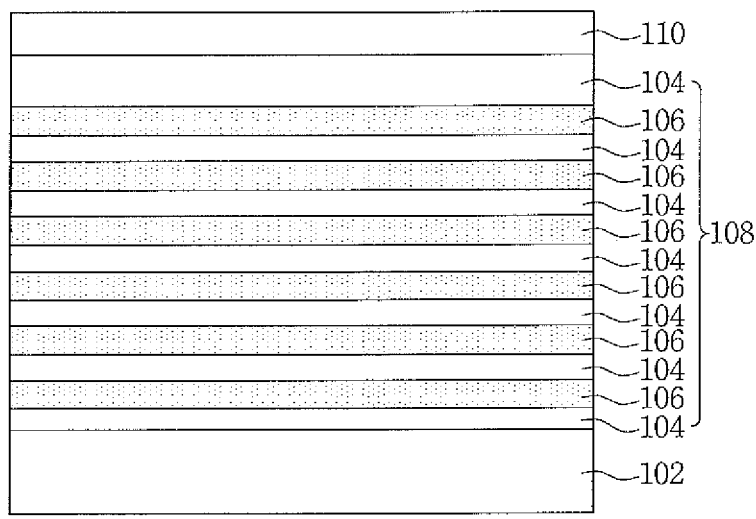
FIGS. 5A to 5Q are cross-sectional views illustrating a method of fabricating a vertical cell-type semiconductor device in accordance with an exemplary embodiment of the inventive concept.
Figure 5B:
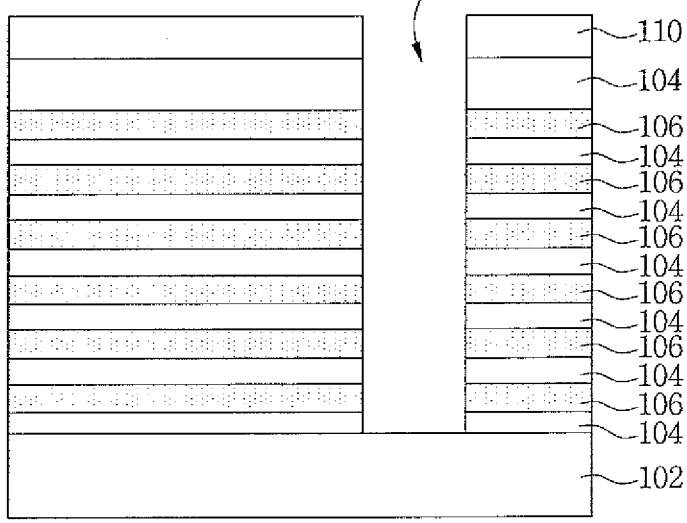
Figure 5C:
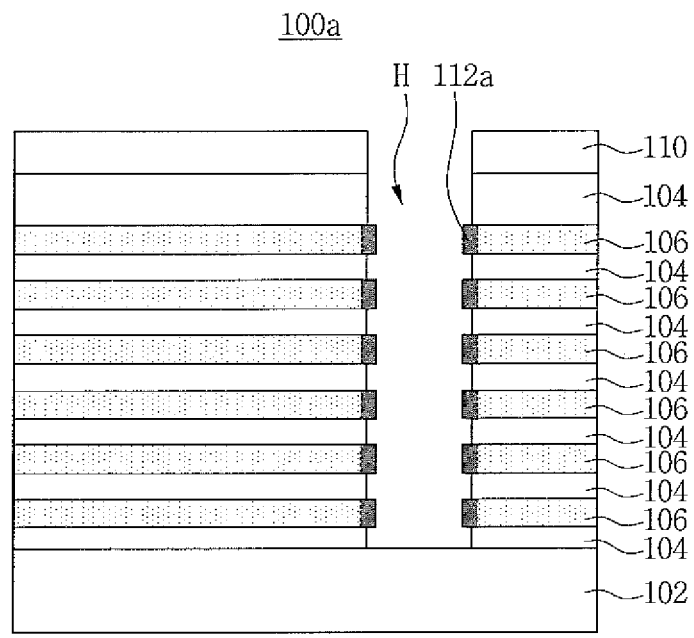
Figure 5D:
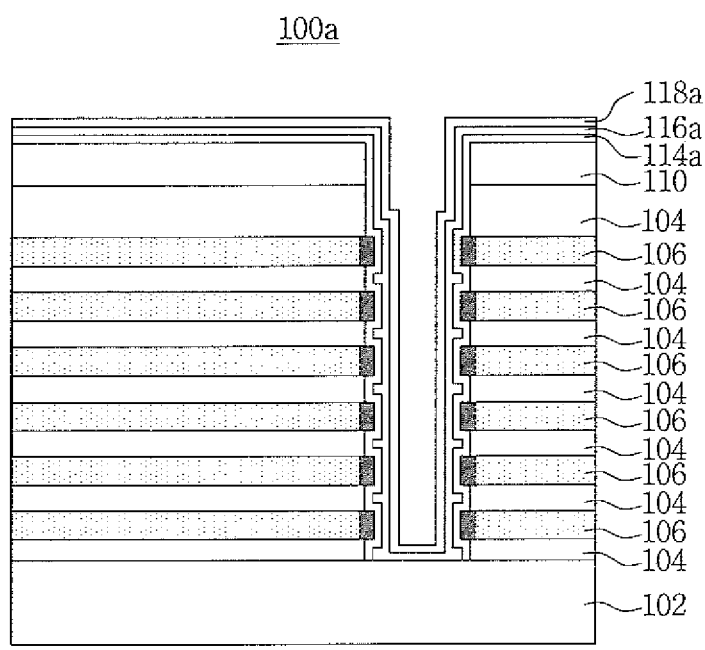
Figure 5E:
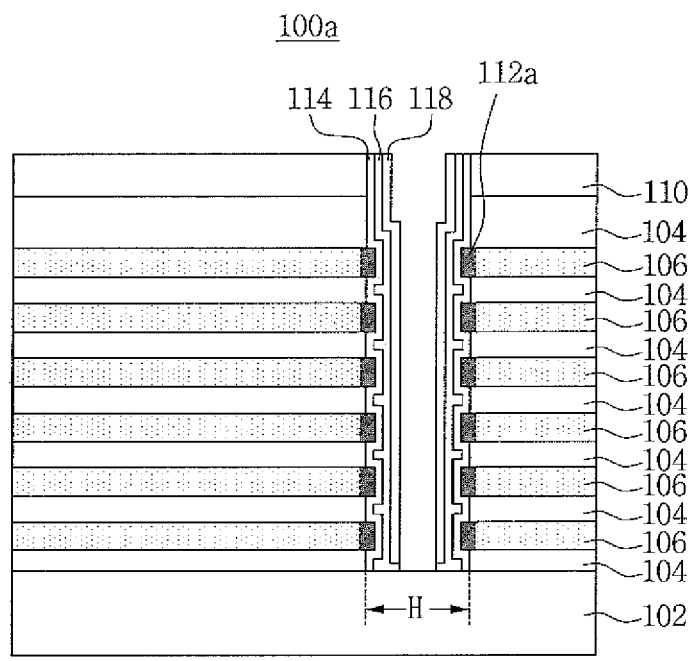
Figure 5F:
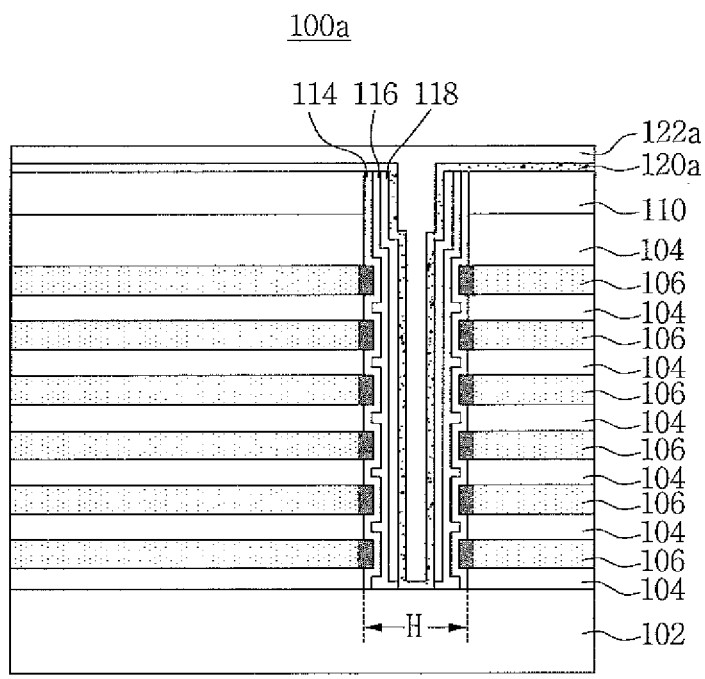
Figure 5G:
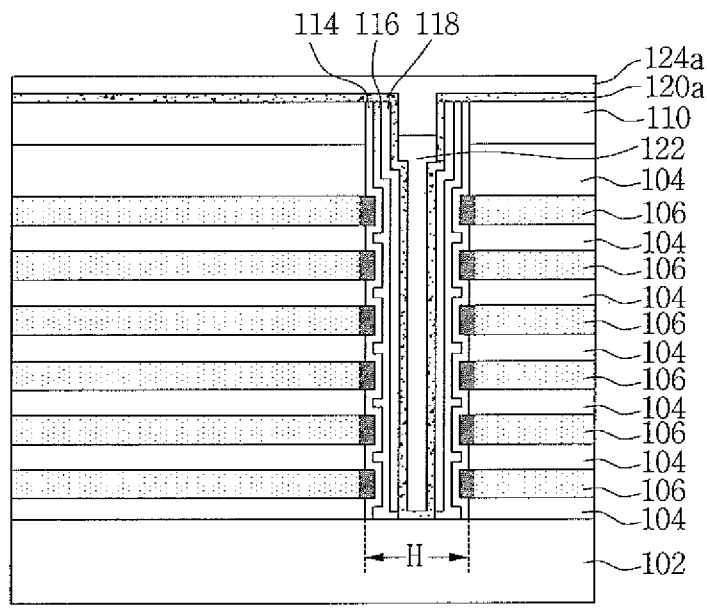
Figure 5H:
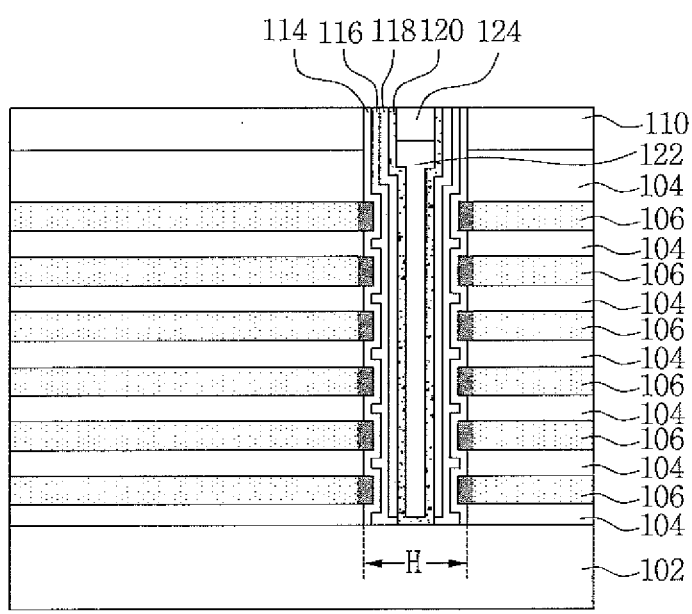
Figure 5I:
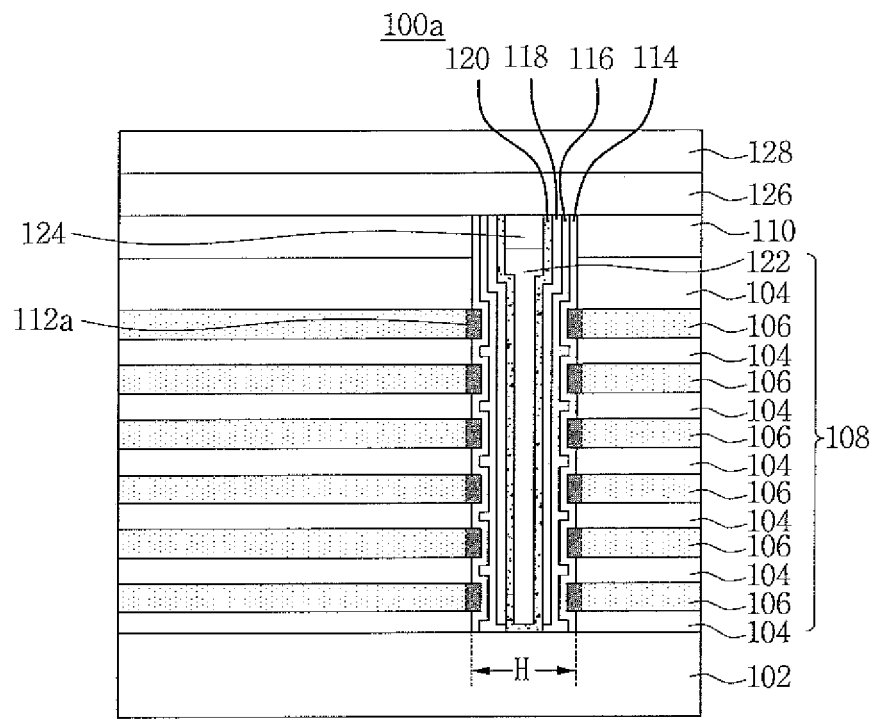
Figure 5J:
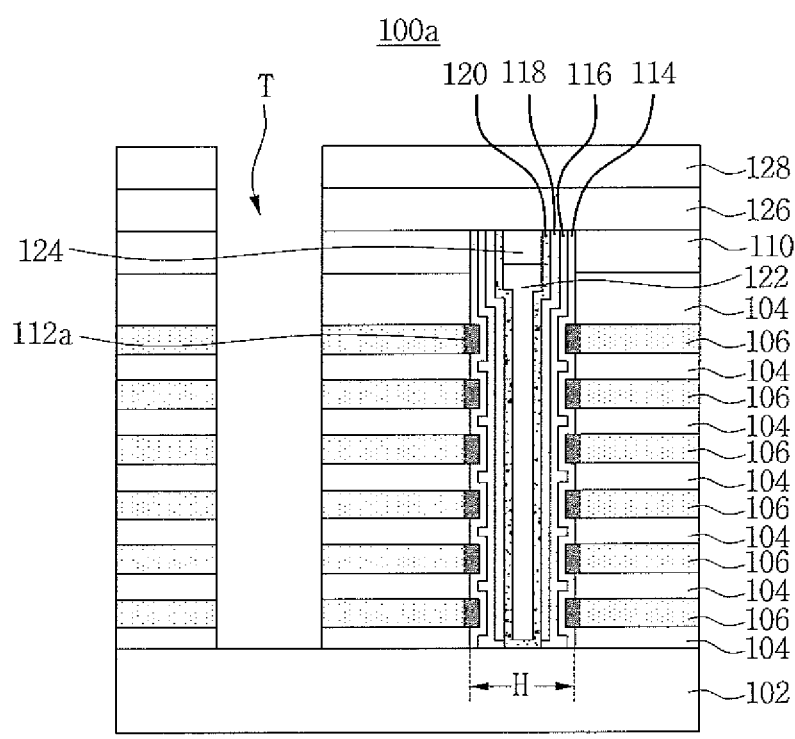
Figure 5K:
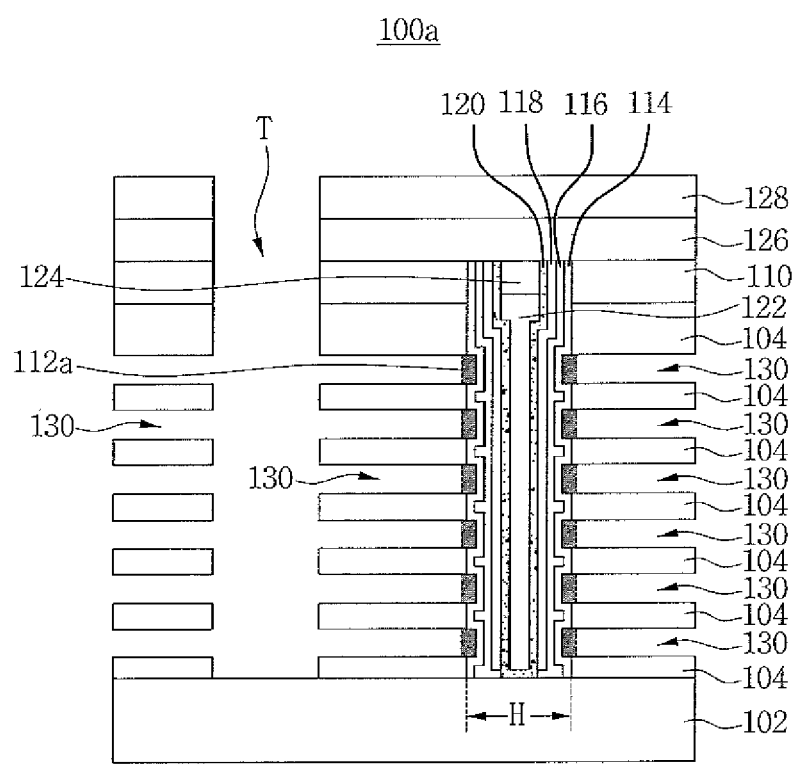
Figure 5L:
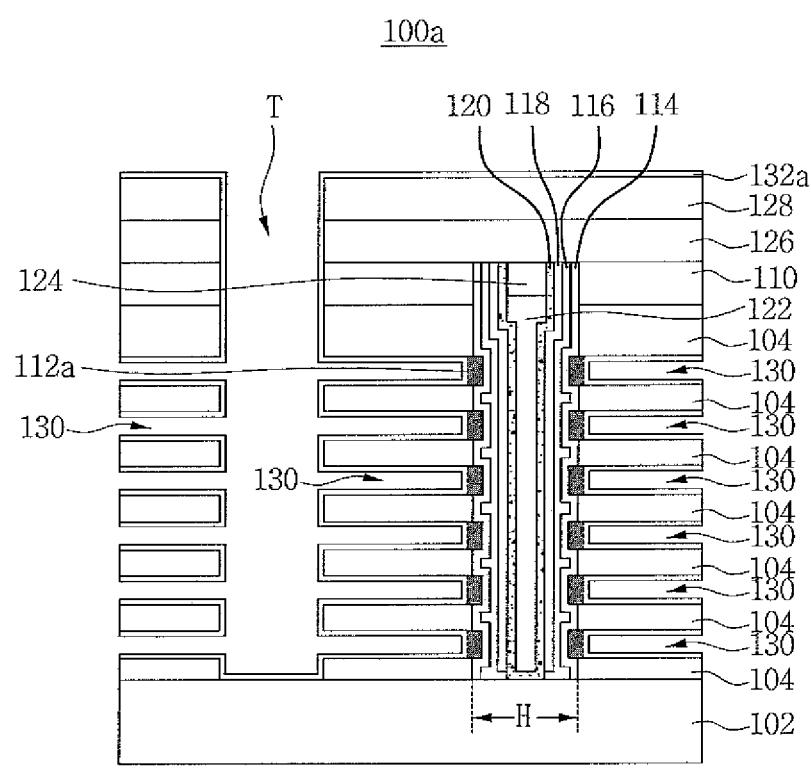
Figure 5M:
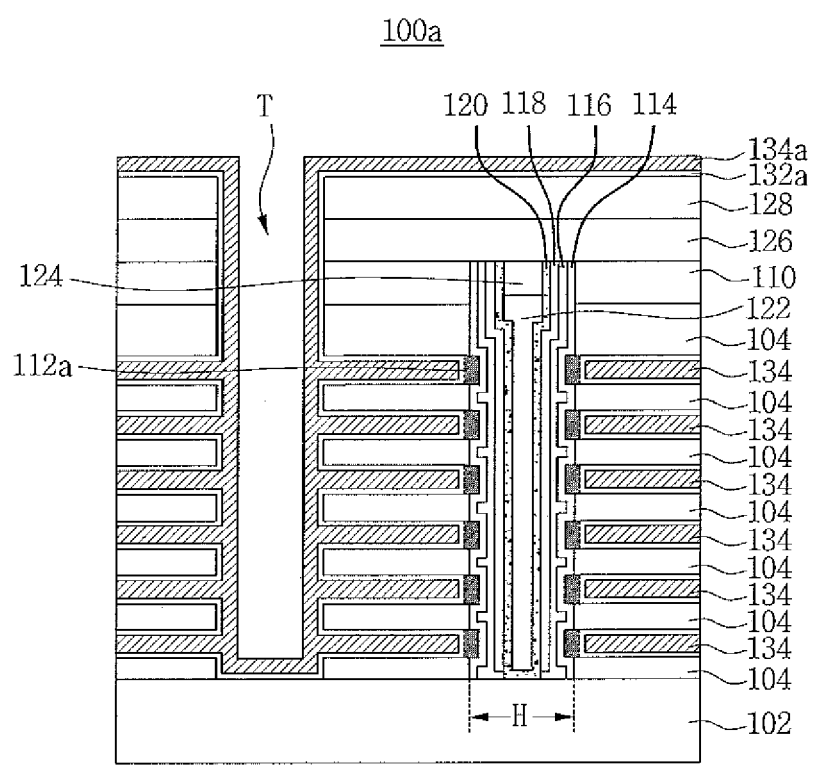
Figure 5N:
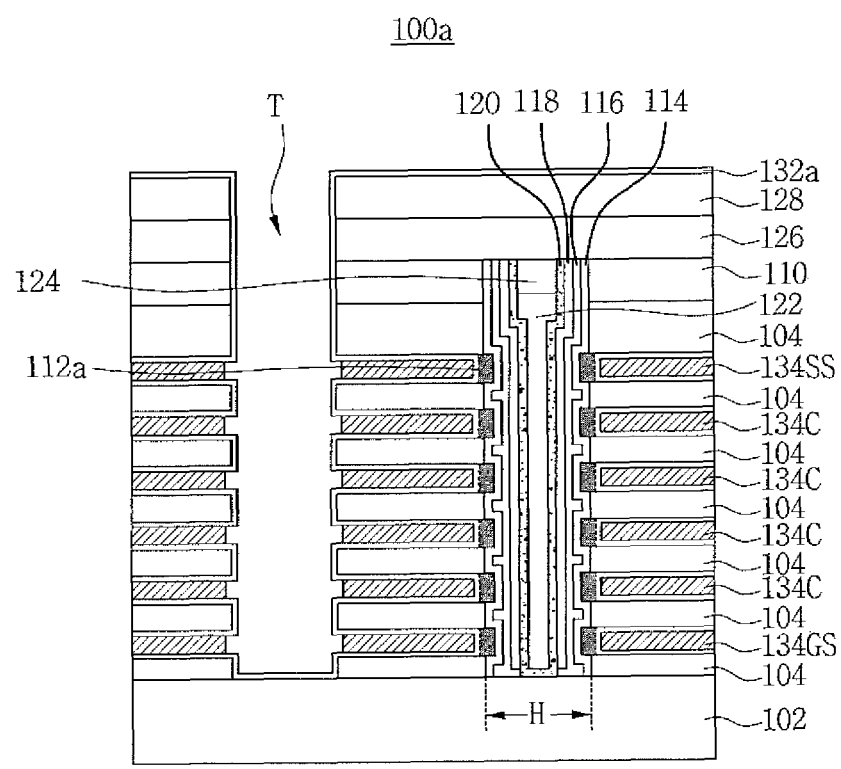
Figure 50:
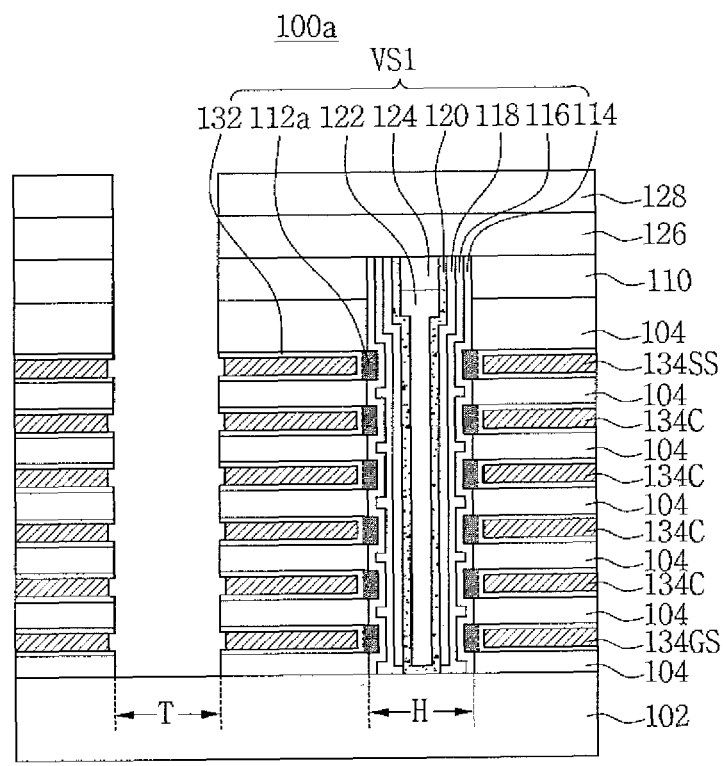
Figure 5P:
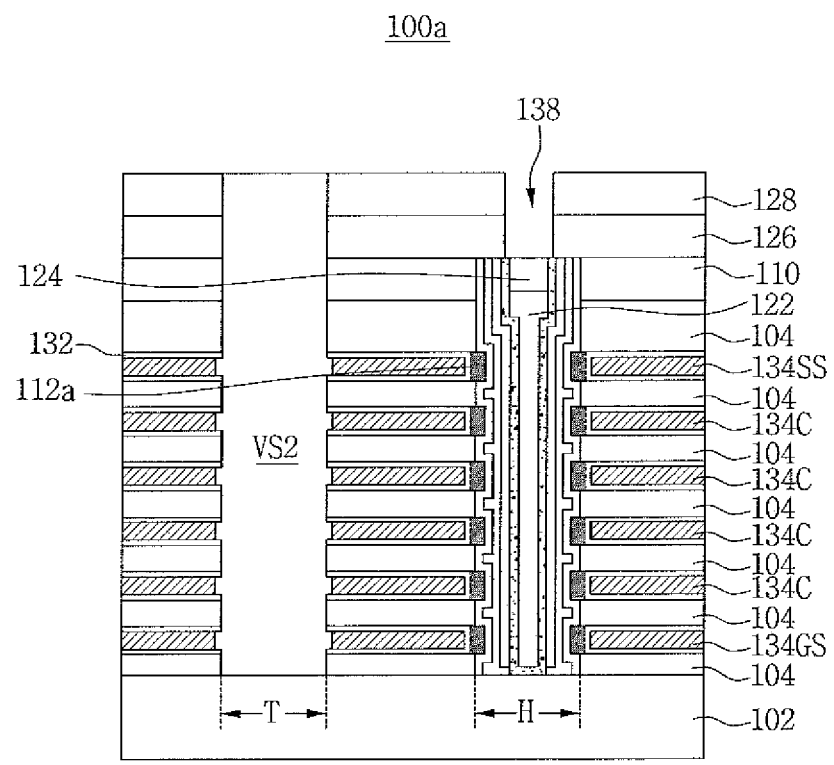
Figure 5Q:
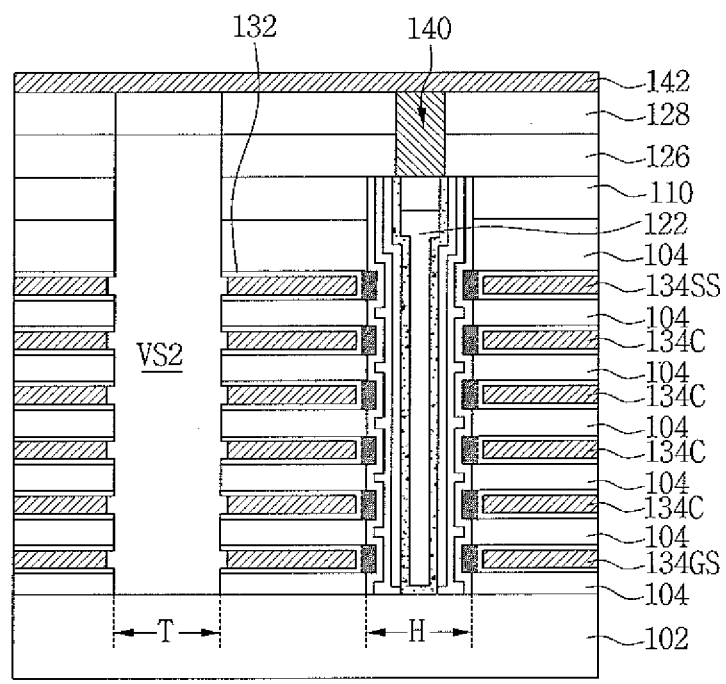

FIGS. 5A to 5Q are cross-sectional views showing a method of fabricating a vertical cell-type semiconductor device in accordance with an exemplary embodiment of the inventive concept.

Referring to FIG. 5A, a preliminary stack structure 108 is formed by alternatively stacking a plurality of interlayer insulating layers 104 and a plurality of sacrificial layers 106 on a substrate 102. A first capping layer 110 is formed on the preliminary stack structure 108. The substrate 102 may include a semiconductor material such as a silicon (Si) substrate, a silicon germanium (SiGe) substrate, or an SOI substrate. The interlayer insulating layer 104 may include silicon oxide ($SiO_2$), and the sacrificial layer 106 may include silicon nitride (SiNx). The first capping layer 110 may include silicon oxide ($SiO_2$).

Referring to FIG. 5B, a through-hole H is formed. The through-hole H vertically penetrates the preliminary stack structure 108 and the first capping layer 110. The through-hole H includes an inner wall exposing side surfaces of the interlayer insulating layer 104 and the sacrificial layer 106. The through-hole H also includes a bottom exposing a portion of the substrate 102.

Referring to FIG. 5C, a protective pattern 112a is formed by oxidizing the sacrificial layer 106 exposed on the inner wall of the through-hole H. In oxidizing the sacrificial layer 106, an oxygen radical may be supplied into the through-hole H and may react with the exposed surface of the sacrificial layer 106. For example, in an oxidation reaction, an oxidized portion of the sacrificial layer 106 may have an increased volume and the oxidized portion (protective pattern 112a) may be densely formed on the surface of the sacrificial layer 106 facing the channel pattern 120.

The oxidation process may include a thermal oxidation process such as an ISSG process, a plasma oxidation process, or a CLN oxidizing process. The ISSG process is an oxygen radical oxidation process using heat, and may include using hydrogen ($H_2$) gas, oxygen ($O_2$) gas, or water vapor ($H_2O$) at a low pressure. For example, the oxidized silicon may be formed in such a manner that an oxygen radical permeates the interior of the sacrificial layer 106 and is bonded to silicon dangling bonds of the interior of the sacrificial layer 106. Alternatively, an oxygen radical may be forcedly permeated into the sacrificial layer 106. For example, the forcedly permeating oxygen radical itself is bonded to silicon dangling bonds by cutting off nitrogen atoms bonded to the silicon. The plasma oxidation process is an oxidation process using plasma, and may use argon (Ar), a gas mixture of hydrogen and oxygen, a gas mixture of argon and oxygen, helium (He), a gas mixture of hydrogen and oxygen, and a gas mixture of helium and oxygen. The CLN oxidation process is a process of forming an oxide layer using oxygen ($O_2$) and hydrogen chloride (HCl), and may obtain an oxide layer with a low impurity concentration due to dry HCl acting as a catalyst and having impurity removal effects. The oxide layer obtained by the oxidation process may have a dense layer and strong bonds compared to an oxide layer obtained by a deposition process.

Referring to FIG. 5D, a barrier dielectric layer 114a is formed on the protective pattern 112a, the interlayer insulating layers 104, and an exposed side surface and top surface of the first capping layer 110 within the through-hole H in a conformal manner. A trap dielectric layer 116*a* is formed on the barrier dielectric layer 114*a* in a conformal manner. A tunneling dielectric layer 118*a* is formed on the trap dielectric layer 116*a* in a conformal manner. The barrier dielectric layer 114*a* may include a silicon oxide, the trap dielectric layer 116*a* may include a silicon nitride (SiNx), and the tunneling dielectric layer 118*a* may include a silicon oxide or a nitrogen-doped silicon oxide.

Referring to FIG. 5E, an anisotropic etching process may be applied to the resulting structure of FIG. 5D. In the anisotropic etching process, a plurality of layers 114*a*, 116*a*, and 118*a* formed on an upper surface of the first capping layer 100 is removed and the plurality of layers 114*a*, 116*a*, and 118*a* formed in the through-hole H remains in the through-hole H. Accordingly, a barrier layer 114, a charge trap layer 116, and a tunneling layer 118 are formed within the through-hole H.

Referring to FIG. 5F, a channel layer 120*a* is formed on the resulting structure of FIG. 5E. For example, the channel layer 120*a* is formed on the substrate exposed by the through-hole H, the tunneling layer 118, and the first capping layer 110. A gapfill layer 122*a* is formed on the channel layer 120*a* and fills the inside of the through-hole H. The channel layer 120*a* may be formed by a chemical vapor deposition (CVD) process such as an atomic layer deposition (ALD) process, and may be formed in a poly-crystalline state through a heat treatment process.

For example, the channel layer 120*a* may include polysilicon. The gapfill layer 122*a* may include an insulating material such as silicon oxide.

Referring to FIG. 5G, a gapfill pattern 122 is formed. A contact layer 124*a* is formed on a top surface of the gapfill pattern 122 and the channel layer 120*a*. In forming the gapfill pattern 122, an etch-back process may be used to remove an upper part of the gapfill layer 122*a* except the lower part of the gapfill layer 122*a* inside of the through-hole H. The top surface of the gapfill pattern 122 is lower than the top surface of the first capping layer 110. The contact layer 124*a* may include polysilicon.

Referring to FIG. 5H, a channel pattern 120 and a contact pad 124 are formed in the through-hole H. In forming the channel pattern 120 and the contact pad 124, a planarization process may be applied to the resulting structure of FIG. 5G, exposing the top surface of the first capping layer 110 by partially removing the channel layer 120*a* and the contact layer 124*a*. The planarization process may include a chemical mechanical planarization (CMP) process.

Referring to FIG. 5I, a second capping layer 126 and a third capping layer 128 are formed on the resulting structure of FIG. 5H. For example, the second and third capping layers 126 and 128 are formed on the through-hole H and the preliminary stack structure 108. The second capping layer 126 and the third capping layer 128 may have etch selectivity with respect to the sacrificial layer 106. For example, when the sacrificial layer 106 includes silicon nitride, the second capping layer 126 and the third capping layer 128 may include silicon oxide.

Referring to FIG. 5J, a trench T is formed. The trench T is spaced apart from the through-hole H and penetrates the first capping layer 110, the second capping layer 126, the third capping layer 128, and the preliminary stack structure 108.

Referring to FIG. 5K, an interlayer space 130 is formed by removing the sacrificial layer 106 positioned between the interlayer insulating layers 104 using an etching process. For example, the etching process may use phosphoric acid ($H_3PO_4$) as an etchant. After removing the sacrificial layer 106 using phosphoric acid, a cleaning process using the RCA Standard Clean 1 (SC-1) may be further performed. In the etching process, the protective patterns 112*a* are exposed to phosphoric acid ($H_3PO_4$), and prevent the phosphoric acid ($H_3PO_4$) from permeating through the protective patterns 112*a* to the inside of the through-hole H. Accordingly, the protective patterns 112*a* may serve to protect the barrier layer 114 and the charge trap layer 116 from being damaged by the phosphoric acid ($H_3PO_4$).

Referring to FIG. 5L, a blocking dielectric layer 132*a* is conformally formed on the resulting structure of FIG. 5K. For example, the blocking dielectric layer 132*a* is formed on the interlayer insulating layer 104 and the protective patterns 112*a* exposed to by the interlayer space 130. The blocking dielectric layer 132*a* is also formed on the first, second, and third capping layers 110, 126, and 128 exposed by the trench T. The blocking dielectric layer 132*a* may include aluminum oxide ($Al_2O_3$) and hafnium oxide (HfO).

Referring to FIG. 5M, a conductive layer 134*a* is formed on the blocking dielectric layer 132*a*. The conductive layer 134*a* is conformally formed in the trench T, filling the interlayer space 130 of FIG. 5L. The conductive layer 134*a* may include a doped semiconductor material such as doped silicon, metal such as tungsten (W), copper (Cu), or aluminum (Al), conductive metal nitride such as titanium nitride (TiN) or tantalum nitride (TaN), a conductive metal-semiconductor compound such as metal silicide, or a transition metal such as titanium (Ti) or tantalum (Ta). In an exemplary embodiment, the conductive layer 134*a* may include tungsten (W) and/or titanium nitride (TiN).

Referring to FIG. 5N, a plurality of gate electrodes 134SS, 134C, and 134GS are formed by partially removing the conductive layer 134*a*. The gate electrode 134GS is referred to as a ground selection gate electrode 134GS and is positioned in the lowest part of the plurality of gate electrodes 134SS, 134C, and 134GS. The gate electrode 134SS is referred to as a string selection gate electrode 134SS and is positioned in the uppermost portion of the plurality of gate electrodes 134SS, 134C, and 134GS. The gate electrodes 134C are referred to as cell gate electrodes 134C and are positioned between the ground selection gate electrode 134GS and the string selection gate electrode 134SS.

In an exemplary embodiment, the number of the cell gate electrodes 134C may be $2^n$ (n being a natural number).

Referring to FIG. 5O, a plurality of blocking layers 132 is formed by partially removing the blocking dielectric layer 132*a* exposed by the trench T. The blocking layer 132 may be formed on a top surface, a bottom surface, and a side surface of each of the gate electrodes 134GS, 134C, and 134SS. The side surface of the gate electrodes 134GS, 134C, and 134SS face toward the channel pattern 120. A first vertical structure VS1 is spaced apart from the trench T, and the first vertical structure VS1 includes the channel pattern 120, the tunneling layer 118, the charge trap layer 116, the barrier layer 114, the protective pattern 112*a*, the blocking layer 132, and the gapfill pattern 122.

Referring to FIG. 5P, a second vertical structure VS2 is formed inside the trench T, and a via 138 is formed to expose the contact pad 124. The second vertical structure VS2 may include silicon oxide ($SiO_2$).

Referring to FIG. 5Q, a contact electrode 140 is formed on the contact pad 124. The contact electrode 140 is in contact with the contact pad 124 and fills the via 138. A conductive line 142 is formed on the contact electrode 140. The conductive line 142 is in contact with the contact electrode 140 and is extended on a top surface of the third capping layer 128. The contact electrode 140 and the conductive line 142 may include a conductive material such as copper (Cu), tungsten (W), or aluminum (Al).

FIGS. 6A to 6D are cross-sectional views showing a method of fabricating a vertical cell-type semiconductor device in accordance with an exemplary embodiment of the inventive concept.

Figure 6A:
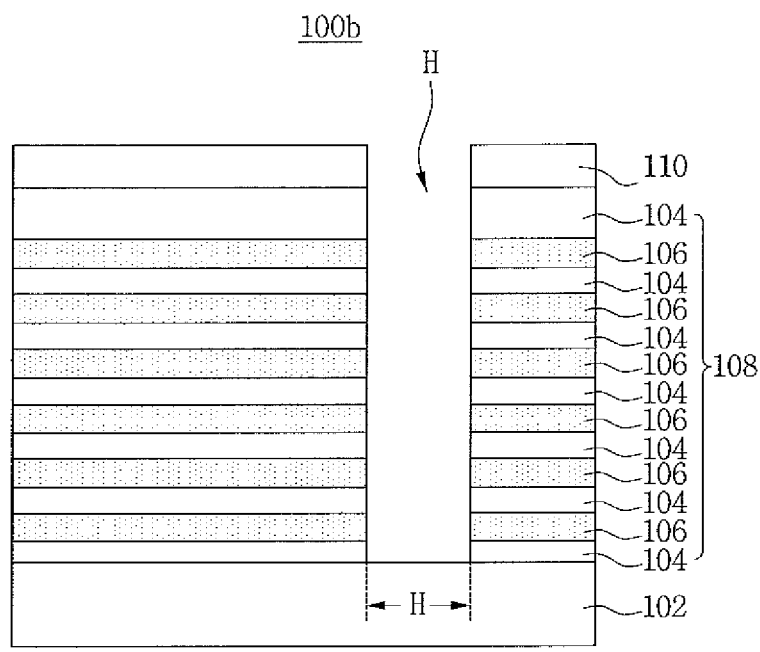
FIGS. 6A to 6D are cross-sectional views illustrating a method of fabricating a vertical cell-type semiconductor device in accordance with an exemplary embodiment of the inventive concept.

Referring to FIG. 6A, a preliminary stack structure 108 is formed. The preliminary stack structure 108 includes a plurality of interlayer insulating layers 104 and a plurality of sacrificial layers 106 alternatively and repeatedly stacked on a substrate 102. A first capping layer 110 is formed on the preliminary stack structure 108. A through-hole H is formed, penetrating the first capping layer 110 and the preliminary stack structure 108 to expose a surface of the substrate 102. The interlayer insulating layers 104 may include silicon oxide, and the sacrificial layers 106 may include silicon nitride.

Figure 6B:
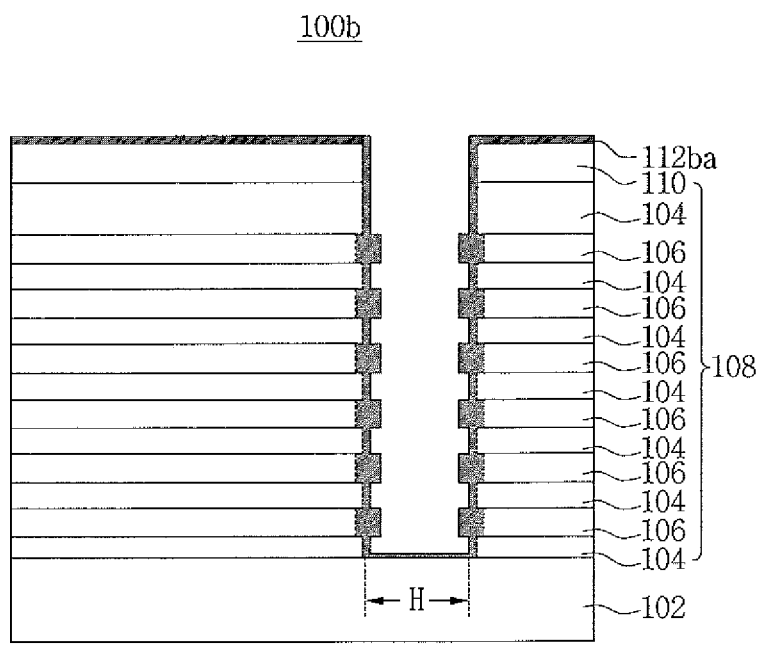

Referring to FIG. 6B, a protective layer 112ba is formed by oxidizing an inner wall of the through-hole H. For example, oxygen is supplied into the through-hole H and permeates surfaces of the interlayer insulating layer 104 and the sacrificial layer 106 which constitute the inner wall of the through-hole H. The permeated oxygen reacts with silicon atoms within the layers 104 and 106. Oxidation reaction may more actively occur in the sacrificial layer 106 than the interlayer insulating layer 104. The interlayer insulating layer 104 may include silicon oxide ($SiO_2$), and the sacrificial layer 106 may include silicon nitride (SiNx). Accordingly, the protective layer 112ba has an uneven surface and has a thicker portion on the side surface of the sacrificial layer 106.

Figure 6C:
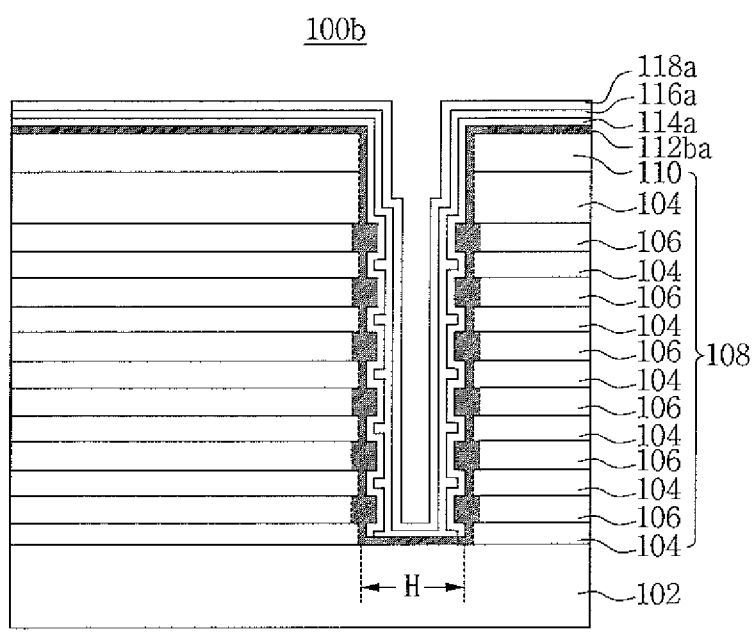

Referring to FIG. 6C, a barrier dielectric layer 114a is formed on the protective layer 112ba in a conformal manner. A trap dielectric layer 116a is formed on the barrier dielectric layer 114a in a conformal manner. A tunneling dielectric layer 118a is formed on the trap dielectric layer 116a in a conformal manner. The barrier dielectric layer 114a may include silicon oxide, the trap dielectric layer 116a may include silicon nitride, and the tunneling dielectric layer 118a may include silicon oxide or nitrogen-doped silicon nitride.

Figure 6D:
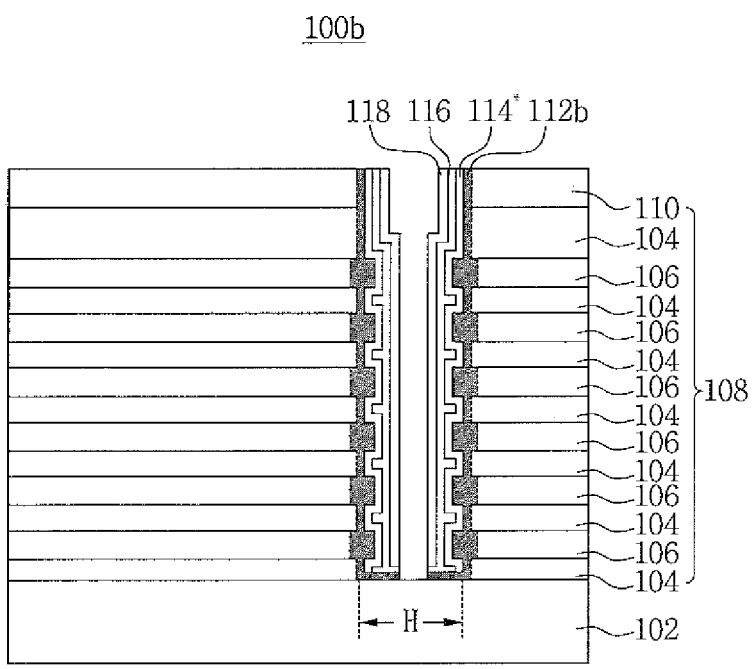

Referring to FIG. 6D, a protective pattern 112b, a barrier layer 114, a charge trap layer 116, and a tunneling layer 118 are formed inside the through-hole H by an anisotropic etching process. The anisotropic etching process may partially remove the protective layer 112ba and the dielectric layers 114a, 116a, and 118a formed on a top surface of the first capping layer 110 except the protective layer 112ba and the dielectric layers 114a, 116a, and 118a formed on the inner wall of the through-hole H. Accordingly, the protective pattern 112b is in contact with the side surface of the through-hole H. The barrier layer 114 is in contact with the protective pattern 112b. The charge trap layer 116 is in contact with the barrier layer 114. A tunneling layer 118 is in contact with the charge trap layer 116. The resulting structure of FIG. 6D may be applied to process steps which are substantially the same as those of FIGS. 5F to 5Q, and thus further description thereof will be omitted.

Figure 7A:
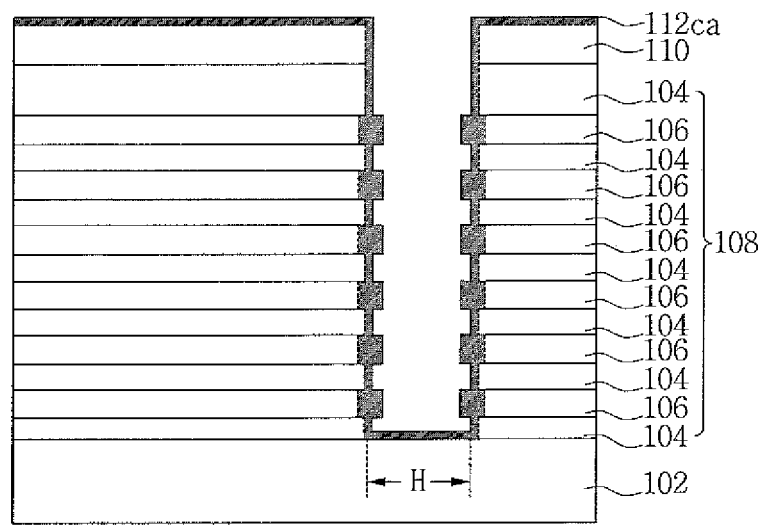
FIGS. 7A to 7C are cross-sectional views illustrating a method of fabricating a vertical cell-type semiconductor device in accordance with an exemplary embodiment of the inventive concept.
Figure 7B:
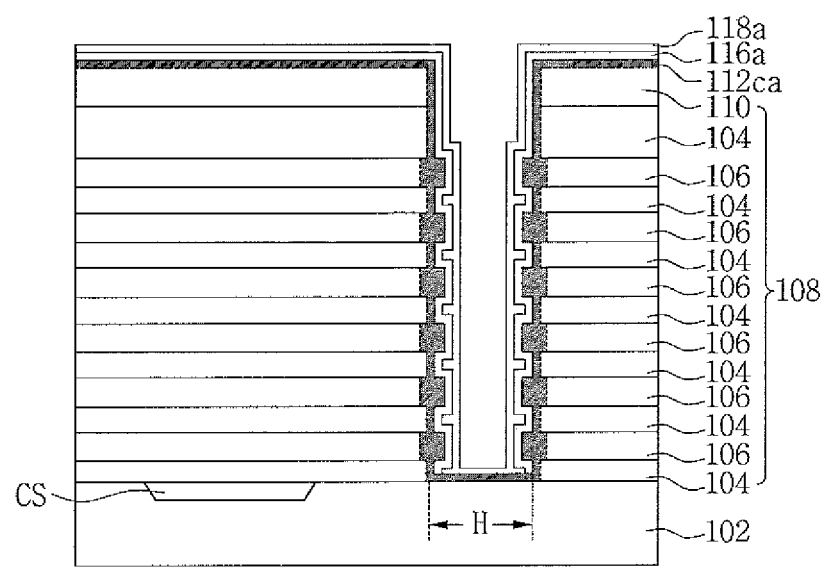
Figure 7C:
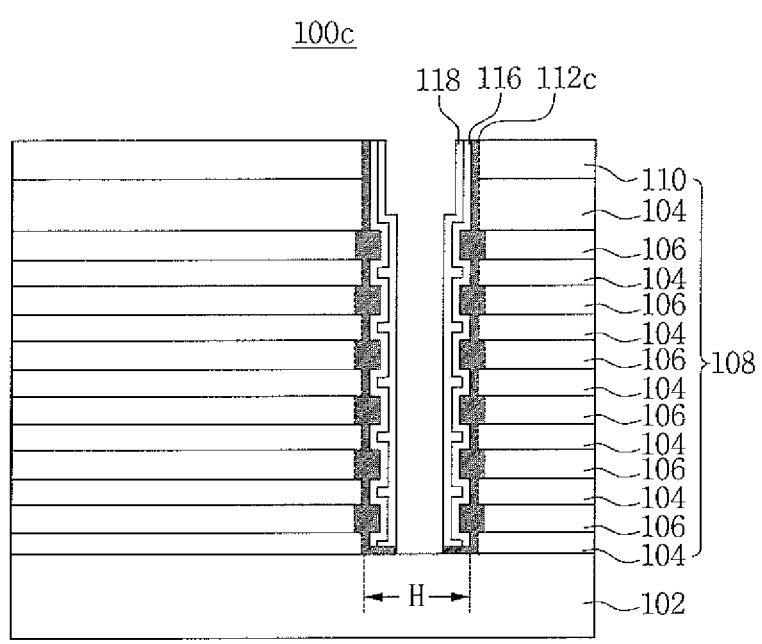

FIGS. 7A to 7C are cross-sectional views showing a method of fabricating a vertical cell-type semiconductor device in accordance with an exemplary embodiment of the inventive concept.

Referring to FIG. 7A, to fabricate a vertical cell-type semiconductor device 100c in accordance with an exemplary embodiment, a preliminary stack structure 108 is formed. The preliminary stack structure 108 includes a plurality of interlayer insulating layers 104 and a plurality of sacrificial layers 106 alternatively and repeatedly stacked on a substrate 102. A first capping layer 110 is on the preliminary stack structure 108. A through-hole H is formed, penetrating the first capping layer 110 and the preliminary stack structure 108. A protective layer 112ca is formed by oxidizing an inner wall of the through-hole H.

Referring to FIG. 7B, a trap dielectric layer 116a is formed on the protective to layer 112ca in a conformal manner. A tunneling dielectric layer 118a is formed on the trap dielectric layer 116a in a conformal manner. The trap dielectric layer 116a may include a silicon nitride, and the tunneling dielectric layer 118a may include silicon oxide or nitrogen-doped silicon oxide.

Referring to FIG. 7C, a protective pattern 112c, a charge trap layer 116, and a tunneling layer 118 are formed by etching the protective layer 112ca, the trap dielectric layer 116a, and the tunneling dielectric layer 118a. The protective pattern 112c may have etching resistance to an etchant for removing the sacrificial layer 106, and may act as a barrier to prevent the etchant from permeating the protective pattern 112c. The barrier layer 114 described in FIGS. 5A-5Q and FIGS. 6A-6D is not included in the semiconductor device 100c. The resulting structure of FIG. 7C may be applied to process steps which are substantially the same as those of FIGS. 5G to 5Q, and thus further description thereof will be omitted.

FIGS. 8A to 8D are cross-sectional views showing a method of fabricating a vertical cell-type semiconductor device in accordance with an exemplary embodiment of the inventive concept.

Figure 8A:
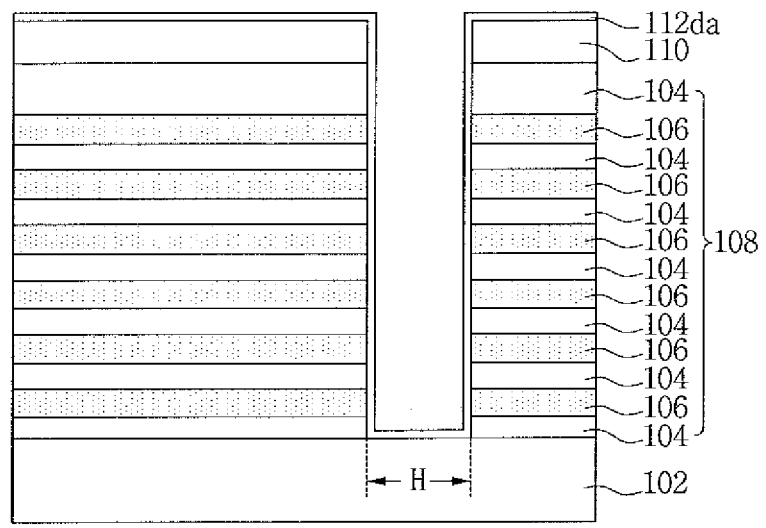
FIGS. 8A to 8D are cross-sectional views illustrating a method of fabricating a vertical cell-type semiconductor device in accordance with an exemplary embodiment of the inventive concept.

Referring to FIG. 8A, to fabricate a vertical cell-type semiconductor device 100d in accordance with an exemplary embodiment, a preliminary stack structure 108 is formed. The preliminary stack structure includes interlayer insulating layers 104 and a first sacrificial layer 106 alternatively and repeatedly stacked on a substrate 102. A first capping layer 110 is formed on the preliminary stack structure 108. A through-hole H is formed, penetrating the first capping layer 110 and the preliminary stack structure 108. A protective dielectric layer 112da is conformally formed on a bottom surface and an inner wall of the through-hole H and a surface of the first capping layer 110. The protective dielectric layer 112da may include silicon oxide.

Figure 8B:
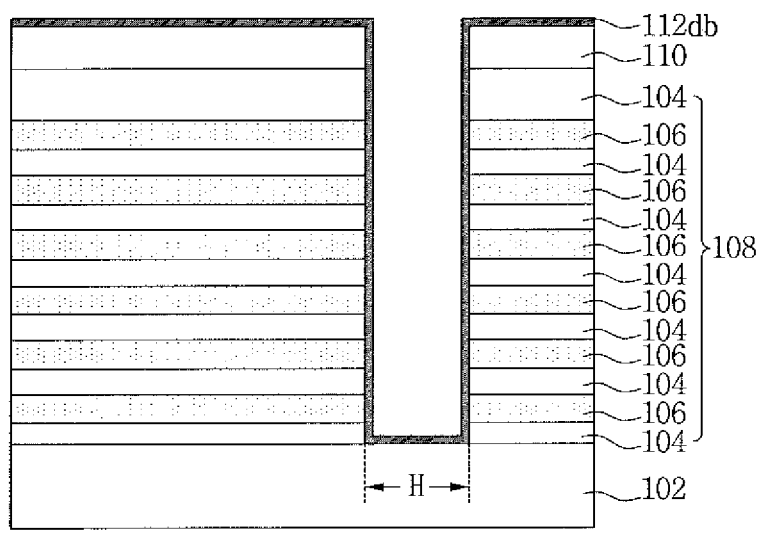

Referring to FIG. 8B, the protective dielectric layer 112da is changed into a densified oxide layer 112db by performing a densifying process. The densifying process may include a thermal oxidizing process such as ISSG, a plasma oxidizing process, and a CLN oxidizing process. In the densifying process, a crystal structure of the protective dielectric layer 112da may be changed from an amorphous state into a polycrystalline state. Dangling bonds of silicon atoms of the protective dielectric layer 112da may be reacted with oxygen. Accordingly, the protective dielectric layer 112da becomes denser.

Figure 8C:
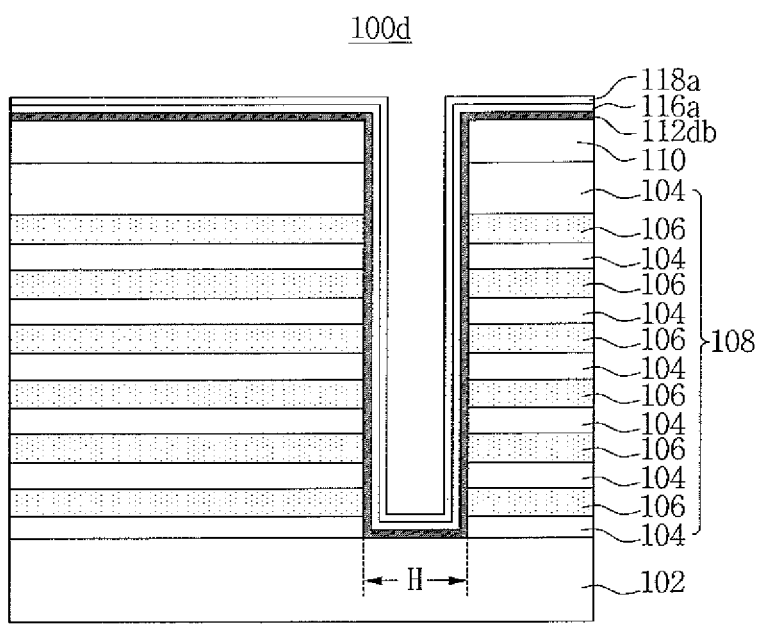

Referring to FIG. 8C, a trap dielectric layer 116a is formed on the densified oxide layer 112db. A tunneling dielectric layer 118a is formed on the trap dielectric layer. The trap dielectric layer 116a may include silicon nitride, and the tunneling dielectric layer (118a) may include silicon oxide or nitrogen-doped silicon oxide.

Figure 8D:
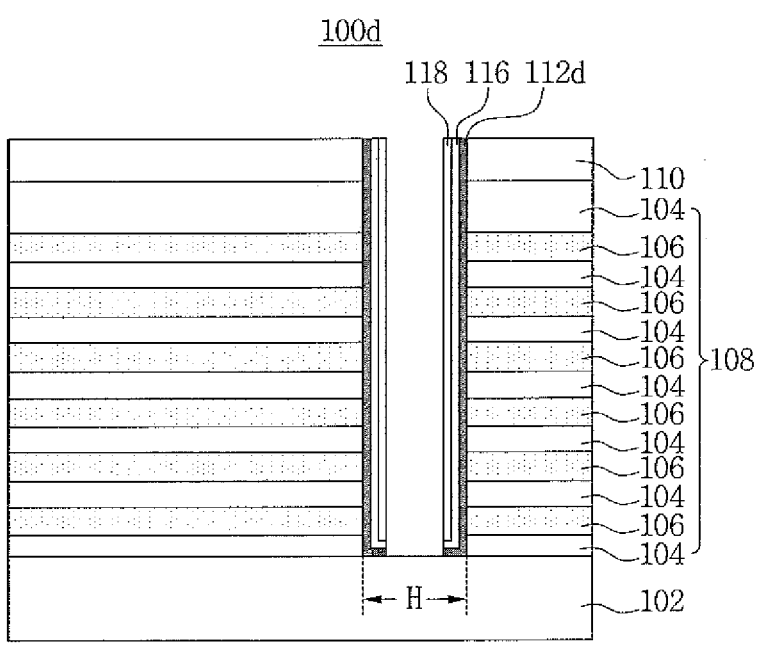

Referring to FIG. 8D, a protective pattern 112d, a charge trap layer 116, and a tunneling layer 118 are formed on an inner wall of the through-hole H using an anisotropic etching process. In the anisotropic etching process, a portion of the densified oxide layer 112db, the trap dielectric layer 116a, the tunneling dielectric layer 118a formed on the top surface of the first capping layer 110, and a portion of the densified oxide layer 112db, the trap dielectric layer 116a, and the tunneling dielectric layer 118a formed on a bottom surface of the through-hole H are removed. Accordingly, the protective pattern 112d, the charge trap layer 116 and the tunneling layer 118 is formed. For example, the densified oxide layer 112db is etched to thereby form the protective pattern 112d in contact with an inner wall of the through-hole H, the trap dielectric layer 116a is etched to thereby form the charge trap layer 116 in contact with the protective pattern 112d, and the tunneling dielectric layer 118a is etched to thereby form the tunneling layer 118 in contact with the charge trap layer 116. In the etching process, a surface of the substrate 102 corresponding to the bottom surface of the through-hole H is partially exposed. The resulting structure of FIG. 8D may be applied to process steps which are substantially the same as those of FIGS. 5F to 5Q, and thus further description thereof will be omitted.

Figure 9:
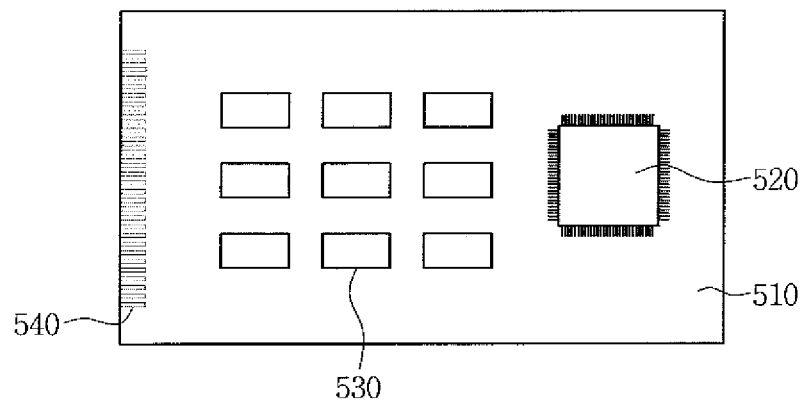
FIG. 9 is a diagram illustrating a semiconductor module including a semiconductor device in accordance with an exemplary embodiment of the inventive concept.

FIG. 9 is a diagram showing a semiconductor module 500 including a semiconductor device in accordance with an exemplary embodiment of the inventive concept.

Referring to FIG. 9, the semiconductor module 500 includes a plurality of semiconductor devices 530 according to an exemplary embodiment of the inventive concept. The plurality of semiconductor devices 530 are mounted on a semiconductor module substrate 510. A microprocessor 520 is mounted on the module substrate 510. Input and output terminals 540 are disposed on at least one side of the module substrate 510. The semiconductor module 500 may be configured as a memory card or a solid state drive (SSD).

Figure 10:
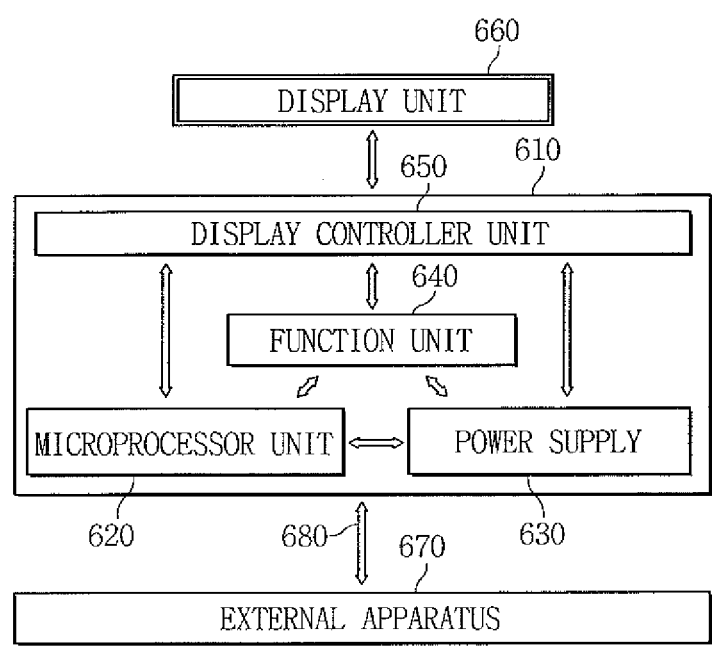
FIG. 10 is a block diagram illustrating an electronic system including a semiconductor device in accordance with an exemplary embodiment of the inventive concept.

FIG. 10 is a block diagram showing an electronic system including a semiconductor device in accordance with an exemplary embodiment of the inventive concept.

Referring to FIG. 10, an electronic system 600 includes a semiconductor device in accordance with an exemplary embodiment of the inventive concept. The electronic system 600 includes a body 610, a microprocessor unit 620, a power supply unit 630, a function unit 640, and/or a display controller unit 650. The body 610 may be a system board or a mother board having a printed circuit board (PCB). The micro processor unit 620, the power supply unit 630, the function unit 640, and the display controller unit 650 are built or mounted on the body 610. The display unit 660 may be disposed on an upper surface of the body 610 or the outside of the body 610. For example, the display unit 660 may be disposed on a surface of the body 610, and may display an image processed by the display controller unit 650. The power supply unit 630 may receive a predetermined voltage from an external power source or the like, may generate a plurality of voltage levels based on the predetermined voltage, and may supply the plurality of voltage levels to the microprocessor unit 620, the function unit 640, and the display controller unit 650, accordingly.

The function unit 640 may perform a plurality of functions of the electronic system 600. For example, when the electronic system 600 is a mobile electronic device such as a mobile phone, the function unit 640 may include a plurality of components for performing wireless communication functions such as an image output to the display unit 660, a voice output to a speaker, and the like, by communicating with an external apparatus 670, and when the electronic system 600 includes a camera, the function unit 640 may act as an image processor. When the electronic system 600 is connected with a memory card or the like to expand capacity, the function unit 640 may act as a memory card controller. The function unit 640 may transmit and receive signals to and from the external apparatus 670 through a communication unit 680. When the electronic system 600 requires a Universal Serial Bus (USB) for function expansion, the function unit 640 may act as an interface controller. A semiconductor device according to an exemplary embodiment may be included in the function unit 640.

Figure 11:
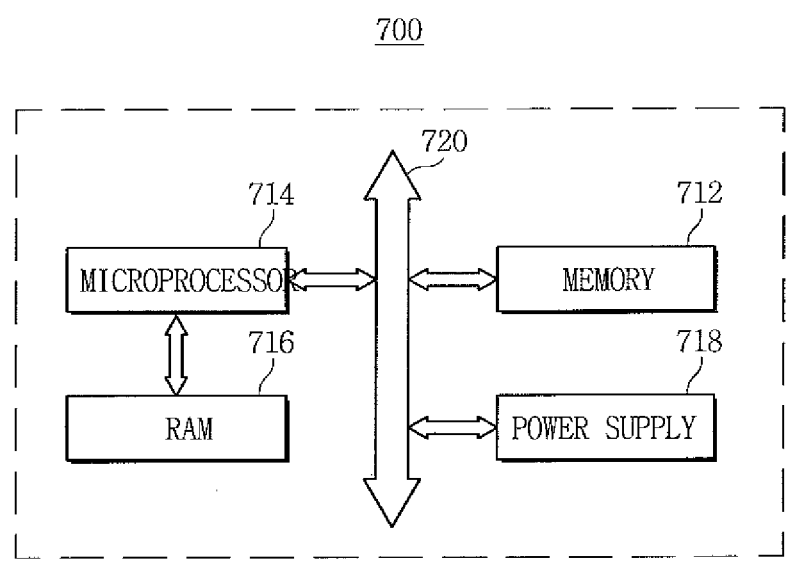
FIG. 11 is a block diagram illustrating an electronic system including a semiconductor device in accordance with an exemplary embodiment of the inventive concept.

FIG. 11 is a block diagram showing an electronic system 700 including a semiconductor device in accordance with an exemplary embodiment of the inventive concept.

The electronic system 700 may be applied to a mobile electronic device or a computer. For example, the electronic system 700 includes a user interface 718 for performing data communication using a memory system 712, a microprocessor 714, a random access memory (RAM) 716, and a bus 720. The microprocessor 714 may program and control the electronic system 700. The RAM 716 may be used as an operation memory of the microprocessor 714. For example, the microprocessor 714 or the RAM 716 may include a semiconductor device in accordance with an exemplary embodiment of the inventive concept. The microprocessor 714, the RAM 716, and/or other components may be assembled within a single package. The user interface 718 may be used to input data to the electronic system 700, or output data from the electronic system 700. The memory system 712 may store codes for operating the microprocessor 714, data processed by the microprocessor 714, or external input data.

Figure 12:
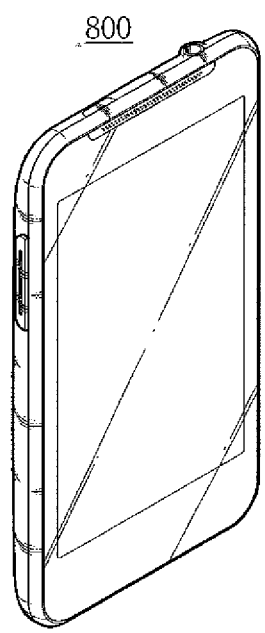
FIG. 12 is a schematic view illustrating a mobile electronic device including a semiconductor device in accordance with an exemplary embodiment of the inventive concept.

FIG. 12 is a schematic view showing a mobile electronic device 800 including a semiconductor device in accordance with an exemplary embodiment of the inventive concept.

The mobile electronic device 800 may be applied to a tablet personal computer (PC). The mobile electronic device 800 may also be applied to mobile computers such as a notebook other than the tablet PC, mpeg-1 audio layer 3 (MP3) players, MP4 players, navigation devices, SSDs, desktop computers, cars and household appliances.

According to an exemplary embodiment, a semiconductor device may include a high-density oxide layer as a dielectric layer between a channel region and gate electrodes in a process of fabricating a vertical cell-type semiconductor device, thereby preventing loss of the charge trap layer in an etching process. Accordingly, a semiconductor device may be reliably fabricated.

While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A semiconductor device comprising:
   a substrate;
   a stack structure including a plurality of interlayer insulating layers and a plurality of gate electrodes alternately stacked on the substrate;
   a through-hole vertically penetrating the stack structure and exposing a portion of the substrate; and
   a vertical structure filling the through-hole,
   wherein the vertical structure includes
   a gapfill pattern formed at a center of the through-hole,
   a channel pattern wrapping an outer surface of the gapfill pattern and being in contact with the exposed portion of the substrate, wherein the channel pattern is formed of a semiconductor material and
   a gate dielectric layer wrapping an outer surface of the channel pattern, and the gate dielectric layer includes a tunneling layer in contact with the channel pattern, a charge trap layer in contact with the tunneling layer, a barrier layer in contact with the charge trap layer, a protective pattern in contact with the barrier layer and denser than the barrier layer, and a blocking layer in contact with the protective pattern and a corresponding gate electrode of the plurality of gate electrodes, wherein the protective pattern includes a first portion interposed between two adjacent interlayer insulating layers of the plurality of interlayer insulating layers and includes a second portion on each of the interlayer insulating layers, wherein a thickness of the first portion is greater than a thickness of the second portion.

2. The semiconductor device according to claim 1, wherein the protective pattern includes oxidized silicon.

3. The semiconductor device according to claim 1, wherein the first portion of the protective pattern, and a gate electrode laterally overlap between the two adjacent interlayer insulating layers.

4. The semiconductor device according to claim 3, wherein a top surface or a bottom of the protective pattern is partially in contact with the bottom surface or the top surface of each of the interlayer insulating layers.

5. The semiconductor device according to claim 4, wherein the protective pattern is in contact with side surfaces of the plurality of interlayer insulating layers facing toward the channel pattern.

6. The semiconductor device according to claim 3, wherein the second portion of the protective pattern is in contact with the barrier layer.

7. The semiconductor device according to claim 1, wherein the barrier layer covers side surfaces of the interlayer insulating layers facing toward the channel pattern.

8. The semiconductor device according to claim 1, wherein the blocking layer completely wraps a top surface, bottom surface, and side surface of a corresponding gate electrode of the plurality of gate electrodes, wherein the side surface of the corresponding gate electrode faces towards channel pattern.

9. The semiconductor device according to claim 1, wherein the tunneling layer and the barrier layer include silicon oxide, the charge trap layer includes silicon nitride, and the blocking layer includes metal oxide.

10. A semiconductor device comprising:
a substrate;
a plurality of interlayer insulating layers and a plurality of gate electrodes alternately stacked in a first direction on the substrate, wherein the plurality of interlayer insulating layers and the plurality of gate electrodes constitute a side surface extended in the first direction;

a gate dielectric layer disposed on the side surface of the plurality of interlayer insulating layers and the plurality of gate electrodes; and a channel pattern disposed on the gate dielectric layer, wherein the gate dielectric layer includes a protective pattern, a charge trap layer, and a tunneling layer, the protective pattern having an uneven side surface and the side surface of the protective pattern including a portion disposed on a corresponding gate electrode of the plurality of gate electrodes, the charge trap layer disposed on the protective pattern, the tunneling layer disposed between the charge trap layer and the channel pattern, wherein the protective pattern is denser than the charge trap layer, and wherein the side surface the plurality of interlayer insulating layers and the plurality of gate electrodes is uneven, wherein the plurality of interlayer insulating layers protrudes toward the channel pattern between two adjacent gate electrodes, wherein the portion of the protective pattern is interposed between two adjacent interlayer insulating layers.

11. The semiconductor device according to claim 10, wherein the protective pattern includes a first silicon oxide formed by an oxidation process, the charge trap layer includes a silicon nitride, and the tunneling layer includes a silicon oxide, wherein the protective pattern is denser than the plurality of interlayer insulating layers.

12. The semiconductor device according to claim 10, wherein the gate dielectric layer further comprises:
a barrier layer formed between the protective pattern and the charge trap layer, and including a silicon oxide, wherein the protective pattern is denser than the barrier layer.

13. The semiconductor device according to 10, wherein the gate dielectric layer further comprises:
a blocking layer disposed between the protective pattern and the corresponding gate electrode.

* * * * *